United States Patent
Kim

(10) Patent No.: US 12,148,749 B2
(45) Date of Patent: Nov. 19, 2024

(54) SEMICONDUCTOR DEVICE AND METHOD FOR FABRICATING THE SAME

(71) Applicant: Samsung Electronics Co., Ltd., Suwon-si (KR)

(72) Inventor: Cheol Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 456 days.

(21) Appl. No.: 17/502,554

(22) Filed: Oct. 15, 2021

(65) Prior Publication Data

US 2022/0302109 A1    Sep. 22, 2022

(30) Foreign Application Priority Data

Mar. 16, 2021    (KR) .................. 10-2021-0033849

(51) Int. Cl.
*H01L 29/66*    (2006.01)
*H01L 21/762*    (2006.01)
*H01L 21/8234*    (2006.01)
*H01L 27/088*    (2006.01)

(52) U.S. Cl.
CPC ...... *H01L 27/088* (2013.01); *H01L 21/76229* (2013.01); *H01L 21/823481* (2013.01)

(58) Field of Classification Search
None
See application file for complete search history.

(56) References Cited

U.S. PATENT DOCUMENTS

| | | | |
|---|---|---|---|
| 9,853,112 B2 | 12/2017 | Liu et al. | |
| 10,325,912 B2 | 6/2019 | Chen et al. | |
| 10,872,891 B2 | 12/2020 | Lin et al. | |
| 10,872,897 B2 | 12/2020 | Yin et al. | |
| 10,879,351 B2 | 12/2020 | Ching et al. | |
| 2012/0264268 A1 | 10/2012 | Lee | |
| 2019/0139957 A1 | 5/2019 | Liao et al. | |
| 2020/0388675 A1 | 12/2020 | Webb et al. | |
| 2020/0403084 A1 | 12/2020 | Hsu et al. | |
| 2021/0098304 A1* | 4/2021 | Chang ............... H01L 29/42392 |

* cited by examiner

*Primary Examiner* — Joseph C. Nicely
*Assistant Examiner* — Lamont B Koo
(74) *Attorney, Agent, or Firm* — Muir Patent Law, PLLC

(57) ABSTRACT

A semiconductor device including a substrate, first and second active patterns, each including first and second side walls, a field insulation layer surrounding side walls of each of the first and second active patterns, a first dam between the first and second active patterns and having a lower surface lower than an upper surface of the field insulation layer, a second dam spaced apart from the first side wall of the first active pattern and having a lower surface lower than the upper surface of the field insulation layer, a first gate electrode on the first dam between the first and second active patterns, a second gate electrode spaced apart from the first gate electrode, and a first gate cut spaced apart from each of the first side walls of each of the first and second active patterns and intersecting each of the first and second gate electrodes.

20 Claims, 54 Drawing Sheets

SEMICONDUCTOR DEVICE AND METHOD FOR FABRICATING THE SAME

CROSS-REFERENCE TO RELATED APPLICATION

This application claims priority from Korean Patent Application No. 10-2021-0033849, filed on Mar. 16, 2021, in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor device and a method for fabricating the same.

2. Description of the Related Art

As one of scaling technologies for increasing the density of semiconductor devices, a multi gate transistor in which a fin or nanowire-shaped silicon body is formed on a substrate and a gate is formed on a surface of the silicon body was proposed.

Since such a multi gate transistor utilizes a three-dimensional channel, scaling is easily performed. Further, even when a gate length of the multi gate transistor is not increased, the current control capability may be improved. Furthermore, a SCE (short channel effect) in which potential of a channel region is influenced by the drain voltage may be effectively suppressed.

SUMMARY

Aspects of the present disclosure provide a semiconductor device and a method for fabricating the semiconductor device in which a gate cut is formed using a sacrificial layer having a lower surface formed to be lower than an upper surface of a field insulation layer, thereby effectively separating between gate electrodes, while maintaining the field insulation layer to improve reliability. In the semiconductor device fabricated by the method for fabricating the semiconductor device, a gate electrode is formed on a dam in which the sacrificial layer is redisposed in the process of forming a gate cut using the sacrificial layer, and a lower surface of a dam formed on a lower surface of the gate electrode may be formed to be lower than the upper surface of the field insulation layer.

According to an exemplary embodiment of the present disclosure, there is provided a semiconductor device, comprising a substrate, a first active pattern which extends lengthwise in a first direction on the substrate, and includes a first side wall and a second side wall opposite to the first side wall, a second active pattern which is spaced apart from the first active pattern in the first direction, extends lengthwise in the first direction, and includes a first side wall and a second side wall opposite to the first side wall, a field insulation layer which surrounds side walls of each of the first and second active patterns on the substrate, a first dam which is disposed between the first active pattern and the second active pattern, and has a lower surface formed to be at a vertical level lower than that of an upper surface of the field insulation layer, a second dam which is spaced apart from the first side wall of the first active pattern in a second direction different from the first direction, and has a lower surface formed to be at a vertical level lower than that of the upper surface of the field insulation layer, a first gate electrode which is disposed on the first dam between the first active pattern and the second active pattern, and extends lengthwise in the second direction, a second gate electrode which is spaced apart from the first gate electrode in the first direction and extends lengthwise in the second direction on the first active pattern, and a first gate cut which is spaced apart from each of the first side wall of the first active pattern and the first side wall of the second active pattern in the second direction, extends lengthwise in the first direction on the first dam, and intersects each of the first and second gate electrodes.

According to an exemplary embodiment of the present disclosure, there is provided a semiconductor device, comprising a substrate, a first active pattern extending lengthwise in a first direction on the substrate, a second active pattern which is spaced apart from the first active pattern in a second direction different from the first direction, and extends lengthwise in the first direction, a third active pattern which is spaced apart from the second active pattern in the first direction and extends lengthwise in the first direction, a fourth active pattern which is spaced apart from each of the second and third active patterns in the second direction and extends lengthwise in the first direction, a field insulation layer which surrounds side walls of each of the first to fourth active patterns, a first dam which is disposed between the second active pattern and the third active pattern and extends lengthwise in the second direction, a second dam which is disposed between the first active pattern and the second active pattern, a third dam which is disposed between the second active pattern and the fourth active pattern, a first gate cut which extends lengthwise in the first direction between the first active pattern and the second active pattern, and is disposed on the first and second dams, a second gate cut which extends lengthwise in the first direction between the second active pattern and the fourth active pattern, and is disposed on the third dam, a first gate electrode which is disposed on the first dam between the second active pattern and the third active pattern, extends lengthwise in the second direction, and intersects the first gate cut, and a second gate electrode which is spaced apart from the first gate electrode in the first direction, extends lengthwise in the second direction on the second active pattern, and intersects each of the first and second gate cuts, wherein a lower surface of the first dam between the second active pattern and the third active pattern is at a vertical level lower than that of an upper surface of the field insulation layer, and wherein a width of the second dam in the second direction is greater than a width of the third dam in the second direction.

According to an exemplary embodiment of the present disclosure, there is provided a method for fabricating a semiconductor device, comprising forming first and second active patterns spaced apart from each other in a first direction on a substrate, each of the first and second active patterns extending lengthwise in the first direction, forming an insulating material layer on the substrate, the first active pattern, and the second active pattern, forming a sacrificial layer inside a trench defined by the insulating material layer between the first active pattern and the second active pattern, etching a part of the insulating material layer to form a field insulation layer, a lower surface of the sacrificial layer being formed to be at a vertical level lower than that of an upper surface of the field insulation layer, forming a dummy gate extending lengthwise in a second direction different from the first direction on an upper surface of the sacrificial layer, removing the sacrificial layer, forming a dam in a portion from which the sacrificial layer is removed, forming a gate spacer along side walls of the dam and side walls of the dummy gate, removing the dummy gate formed on the dam to form a gate trench, and forming a gate electrode inside the gate trench.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof referring to the attached drawings, in which like numerals refer to like elements throughout. In the drawings.

DETAILED DESCRIPTION OF THE EMBODIMENTS

Although drawings of a semiconductor device according to some embodiments describe an example which includes MBCFET™ (Multi-Bridge Channel Field Effect Transistor) including a nanosheet, and a fin-shaped transistor (FinFET) including a fin type pattern-shaped channel region, the present disclosure is not limited thereto.

As used herein, terms such as "same," "equal," "planar," or "coplanar," when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes Hereinafter, a semiconductor device according to some embodiments of the present disclosure will be described referring to FIGS. 1 to 4.

Figure 1:
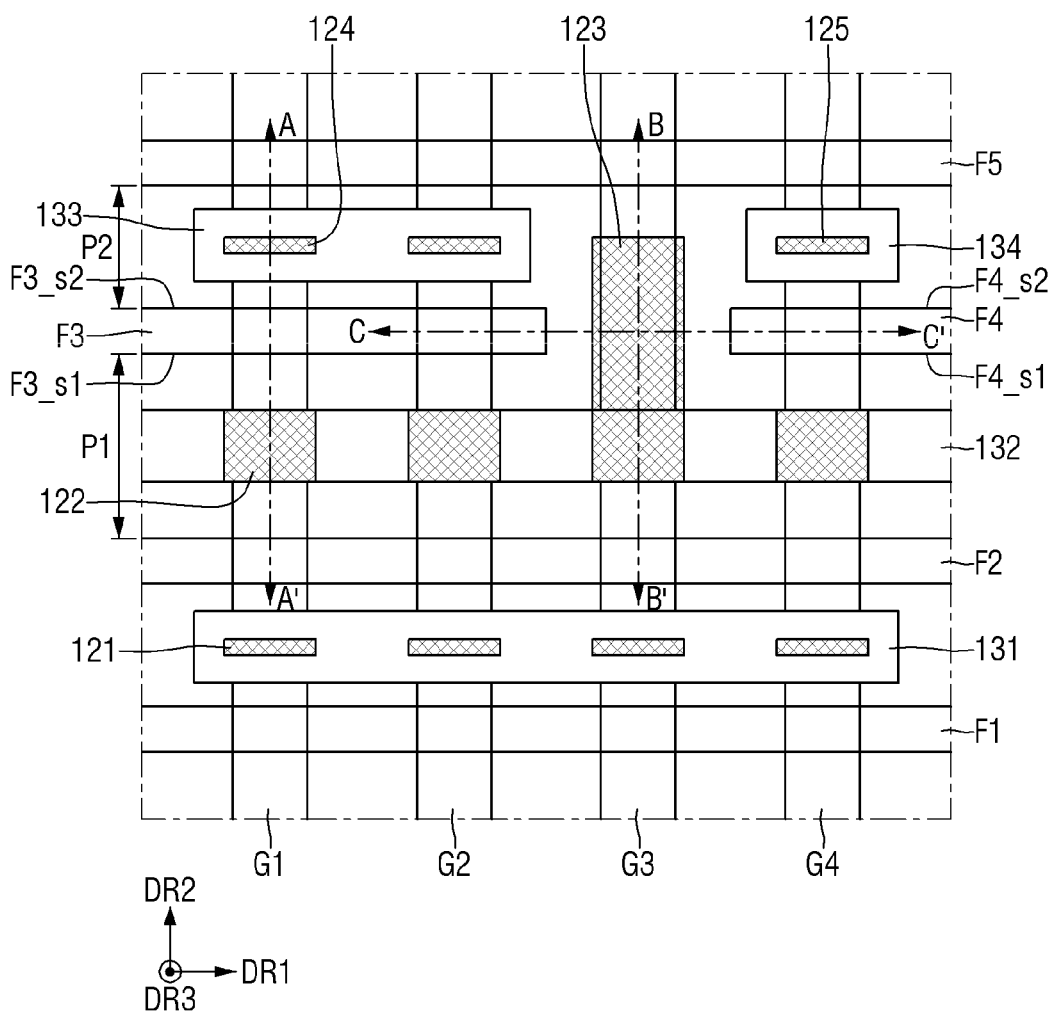
FIG. 1 is a layout diagram for explaining a semiconductor device, according to some example embodiments of the present disclosure.
Figure 2:
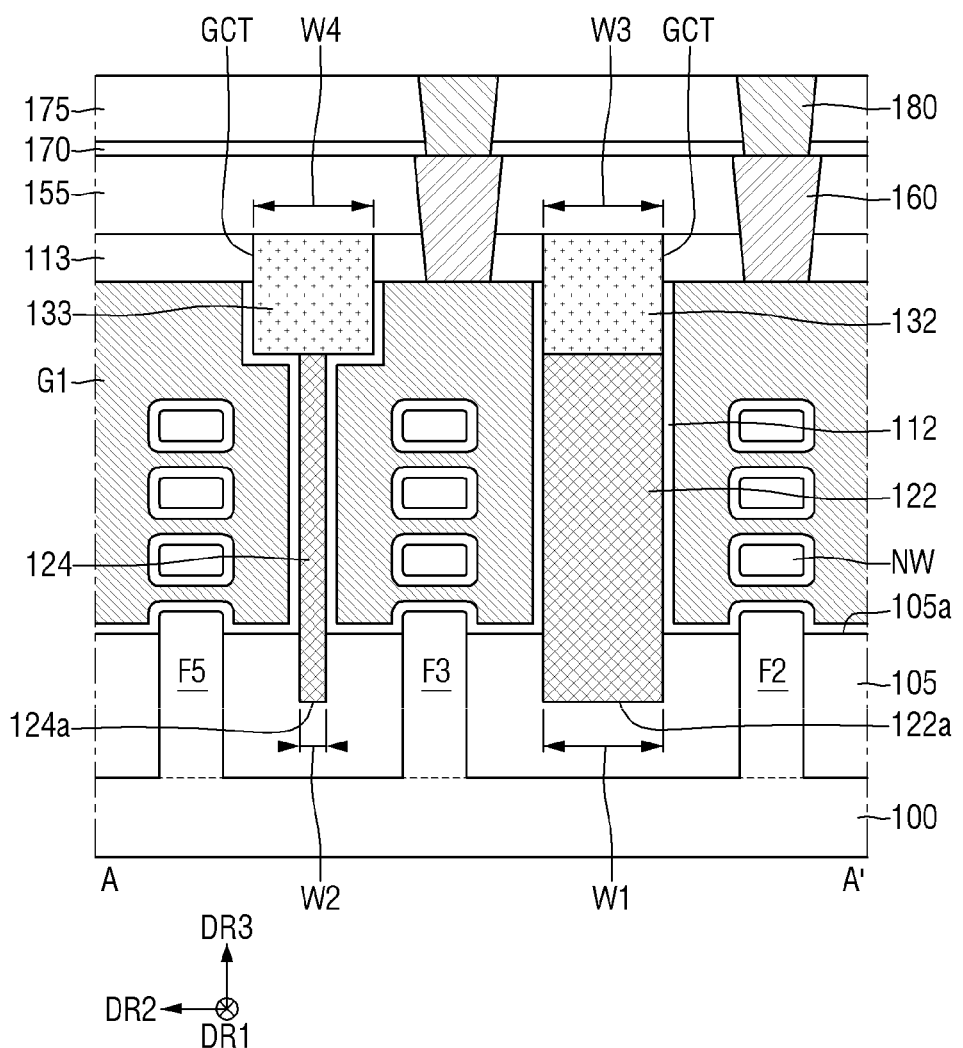
FIG. 2 is a cross-sectional view taken along A-A' of FIG. 1.
Figure 3:
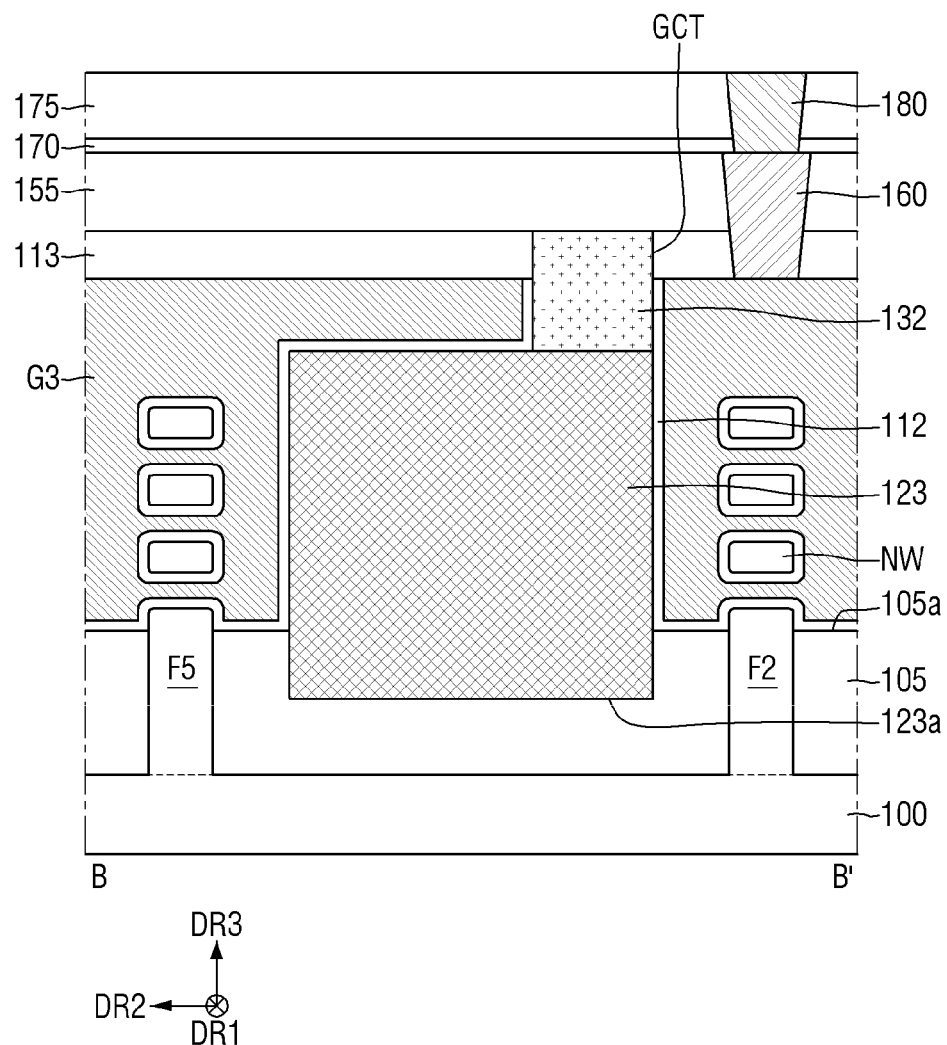
FIG. 3 is a cross-sectional view taken along B-B' of FIG. 1.
Figure 4:
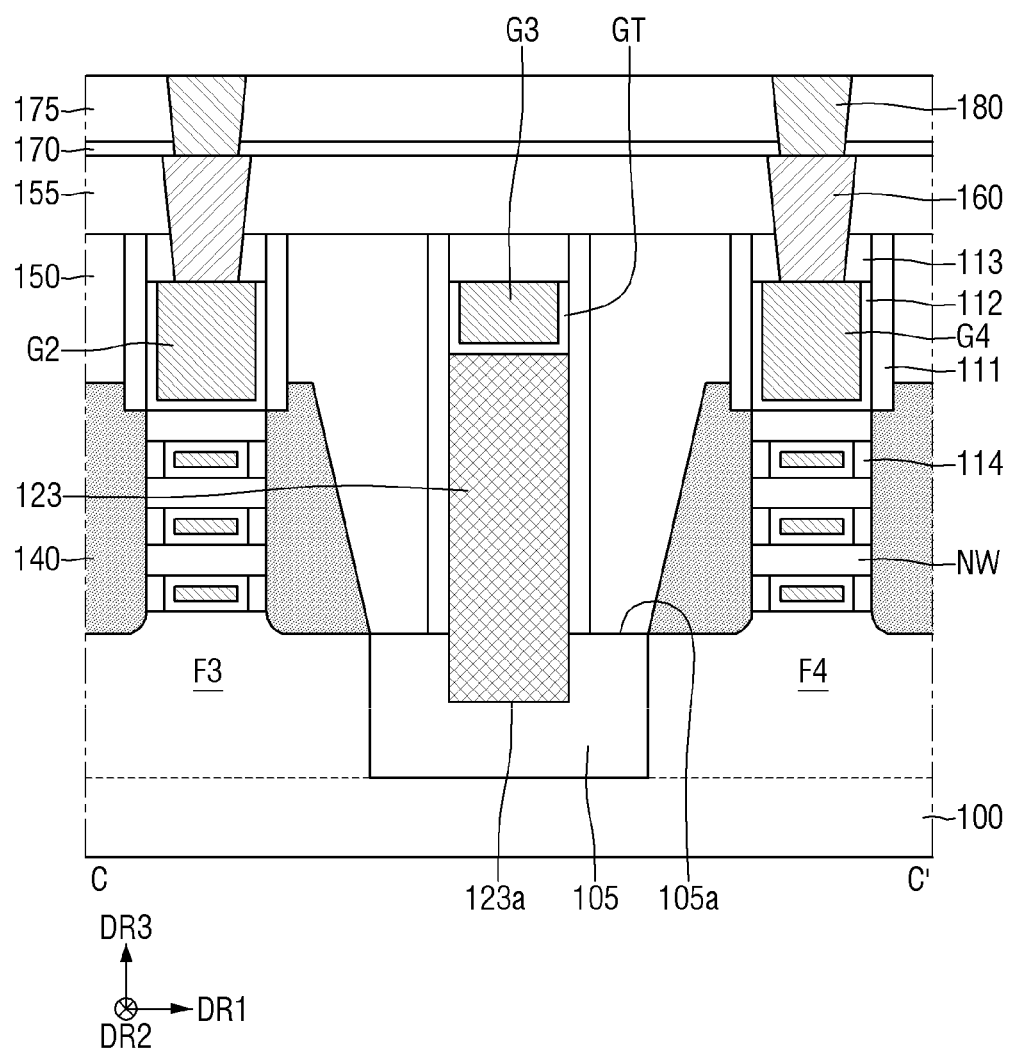
FIG. 4 is a cross-sectional view taken along C-C' of FIG. 1.

FIG. 1 is a layout diagram for explaining a semiconductor device according to some example embodiments of the present disclosure. FIG. 2 is a cross-sectional view taken along A-A' of FIG. 1. FIG. 3 is a cross-sectional view taken along B-B' of FIG. 1. FIG. 4 is a cross-sectional view taken along C-C' of FIG. 1.

Referring to FIGS. 1 to 4, the semiconductor device according to some example embodiments of the present disclosure includes a substrate 100, first to fifth active patterns F1 to F5, a field insulation layer 105, a plurality of nanosheets NW, first to fourth gate electrodes G1 to G4, a gate spacer 111, a gate insulation layer 112, a capping pattern 113, an internal spacer 114, first to fifth dams 121 to 125, first to fourth gate cuts 131 to 134, a source/drain region 140, a first interlayer insulating film 150, a second interlayer insulating film 155, a gate contact 160, an etching stop film 170, a third interlayer insulating film 175, and a via 180.

The substrate 100 may be a silicon substrate or an SOI (silicon-on-insulator). In contrast, although the substrate 100 may include silicon germanium, SGOI (silicon germanium on insulator), indium antimonide, lead tellurium compounds, indium arsenic, indium phosphide, gallium arsenide or gallium antimonide, the present disclosure is not limited thereto.

Each of the first to fifth active patterns F1 to F5 may protrude from the substrate 100 in a vertical direction DR3. A first active pattern F1 may extend lengthwise in a first direction DR1. A second active pattern F2 may be spaced apart from the first active pattern F1 in a second direction DR2 different from the first direction DR1. The second active pattern F2 may extend lengthwise in the first direction DR1. A third active pattern F3 may be spaced apart from the second active pattern F2 in the second direction DR2. The third active pattern F3 may extend lengthwise in the first direction DR1. An item, layer, or portion of an item or layer described as extending "lengthwise" in a particular direction has a length in the particular direction and a width perpendicular to that direction, where the length is greater than the width. In example embodiments, the first direction DR1 and the second direction DR2 may be perpendicular to one another. The vertical direction DR3 may be perpendicular to the upper surface 105a of the field insulation layer 105.

A fourth active pattern F4 may be spaced apart from the second active pattern F2 in the second direction DR2. The fourth active pattern F4 may be spaced apart from the third active pattern F3 in the first direction DR1. The fourth active pattern F4 may extend lengthwise in the first direction DR1. The fifth active pattern F5 may be spaced apart from each of the third active pattern F3 and the fourth active pattern F4 in the second direction DR2. The fifth active pattern F5 may extend lengthwise in the first direction DR1.

For example, a first pitch P1 in the second direction DR2 between the second active pattern F2 and the third active pattern F3 may be greater than a second pitch P2 in the second direction DR2 between the third active pattern F3 and the fifth active pattern F5.

Each of the first to fifth active patterns F1 to F5 may be a part of the substrate 100, and may include an epitaxial layer that is grown from the substrate 100. Each of the first to fifth active patterns F1 to F5 may include, for example, silicon or germanium, which are elemental semiconductor materials. Further, each of the first to fifth active patterns F1 to F5 may include a compound semiconductor, and may include, for example, a group Iv-Iv compound semiconductor or a group III-V compound semiconductor.

The group IV-IV compound semiconductor may include, for example, a binary compound or a ternary compound including at least two or more of carbon (C), silicon (Si), germanium (Ge), and tin (Sn), or a compound obtained by doping these elements with a group IV element. The group III-V compound semiconductor may be, for example, at least one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element.

A field insulation layer 105 may be disposed on the substrate 100. The field insulation layer 105 may surround the side walls of each of the first to fifth active patterns F1 to F5. Each of the first to fifth active patterns F1 to F5 may protrude in the vertical direction DR3 from an upper surface 105a of the field insulation layer 105. For example, upper surfaces of each of the first to fifth active patterns F1 to F5 may be at higher vertical levels than that of the upper surface 105a of the field insulation layer 105. The field insulation layer 105 may include, for example, an oxide film, a nitride film, an oxynitride film, or a combination film thereof.

A plurality of nanosheets NW may be disposed on each of the first to fifth active patterns F1 to F5. The plurality of nanosheets NW may include a plurality of nanosheets that are spaced apart from each other in the vertical direction DR3 and stacked. The plurality of nanosheets NW may be disposed at intersections between each of the first to fifth active patterns F1 to F5 and each of the first to fourth gate electrodes G1 to G4.

The plurality of nanosheets NW may be spaced apart from each other in the first direction DR1 and/or the second direction DR2. For example, the plurality of nanosheets NW disposed at the intersection between the third active pattern F3 and the first gate electrode G1 may be spaced apart from the plurality of nanosheets NW disposed at the intersection between the third active pattern F3 and the second gate electrode G2 in the first direction DR1.

Although FIGS. 2 to 4 show that the plurality of nanosheets NW include three nanosheets spaced apart from each other in the vertical direction DR3 and stacked, this is merely for convenience of explanation, and the present disclosure is not limited thereto. In some other embodiments, the plurality of nanosheets NW may include four or more nanosheets that are spaced apart from each other in the vertical direction DR3 and stacked.

A first gate electrode G1 may extend lengthwise in the second direction DR2 on the field insulation layer 105, the first active pattern F1, the second active pattern F2, the third active pattern F3, and the fifth active pattern F5. The first gate electrode G1 may intersect each of the first active pattern F1, the second active pattern F2, the third active pattern F3, and the fifth active pattern F5. For example, the first gate electrode G1 may cross over each of the first active pattern F1, the second active pattern F2, the third active pattern F3, and the fifth active pattern F5.

A second gate electrode G2 may extend lengthwise in the second direction DR2 on the field insulation layer 105, the first active pattern F1, the second active pattern F2, the third active pattern F3, and the fifth active pattern F5. The second gate electrode G2 may be spaced apart from the first gate electrode G1 in the first direction DR1. The second gate electrode G2 may intersect each of the first active pattern F1, the second active pattern F2, the third active pattern F3, and the fifth active pattern F5. For example, the second gate electrode G2 may cross over each of the first active pattern F1, the second active pattern F2, the third active pattern F3, and the fifth active pattern F5.

A third gate electrode G3 may extend lengthwise in the second direction DR2 on the field insulation layer 105, the first active pattern F1, the second active pattern F2 and the fifth active pattern F5. The third gate electrode G3 may be spaced apart from the second gate electrode G2 in the first direction DR1. The third gate electrode G3 may intersect each of the first active pattern F1, the second active pattern F2, and the fifth active pattern F5. For example, the third gate electrode G3 may cross over each of the first active pattern F1, the second active pattern F2, and the fifth active pattern F5.

A fourth gate electrode G4 may extend lengthwise in the second direction DR2 on the field insulation layer 105, the first active pattern F1, the second active pattern F2, the fourth active pattern F4, and the fifth active pattern F5. The fourth gate electrode G4 may be spaced apart from the third gate electrode G3 in the first direction DR1. The fourth gate electrode G4 may intersect each of the first active pattern F1, the second active pattern F2, the fourth active pattern F4, and the fifth active pattern F5. For example, the fourth gate electrode G4 may cross over each of the first active pattern F1, the second active pattern F2, the fourth active pattern F4, and the fifth active pattern F5.

Each of the first to fourth gate electrodes G1 to G4 may surround a plurality of nanosheets NW. Each of the first to fourth gate electrodes G1 to G4 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. Each of the first to fourth gate electrodes G1 to G4 may include a conductive metal oxide, a conductive metal oxynitride, and the like, and may also include an oxidized form of the above-mentioned materials.

A first dam 121 may be disposed on the field insulation layer 105 between the first active pattern F1 and the second active pattern F2. For example, the first dam 121 may include four dams spaced apart from each other in the first direction DR1. Each of the first dams 121 may separate each of the first to fourth gate electrodes G1 to G4 in the second direction DR2. A part of the side wall of the first dam 121 may be surrounded by the field insulation layer 105. For example, a lower surface of the first dam 121 may be formed to be at a vertical level lower than that of the upper surface 105a of the field insulation layer 105. In example embodiments, the field insulation layer 105 may contact the part of the side wall of the first dam 121. The term "contact," as used herein, refers to a direct connection (i.e., touching) unless the context indicates otherwise.

A second dam 122 may be disposed on the field insulation layer 105 between the second active pattern F2 and the third active pattern F3. Further, the second dam 122 may be disposed on the field insulation layer 105 between the second active pattern F2 and the fourth active pattern F4. For example, the second dam 122 may include three dams spaced apart from each other in the first direction DR1. Each of the second dams 122 may separate each of the first, second, and fourth gate electrodes G1, G2, and G4 in the second direction DR2. A part of the side wall of the second dam 122 may be surrounded by the field insulation layer 105. For example, a lower surface 122a of the second dam 122 may be formed to be at a vertical level lower than that of the upper surface 105a of the field insulation layer 105. In some embodiments, the lower surface 122a of the second dam 122 may be substantially planar. For example, the lower surface 122a of the second dam 122 may be parallel to an upper surface of the substrate 100. In example embodiments, the field insulation layer 105 may contact the part of the side wall of the second dam 122.

A third dam 123 may be disposed on the field insulation layer 105 between the second active pattern F2 and the fifth active pattern F5. The third dam 123 may extend lengthwise in the second direction DR2 along the third gate electrode G3. The third dam 123 may separate the third gate electrode G3 in the second direction DR2. A part of the third gate electrode G3 may be disposed on the third dam 123. For example, a part of the third gate electrode G3 may be disposed on the third dam 123 between the third active pattern F3 and the fourth active pattern F4. A part of the side wall of the third dam 123 may be surrounded by the field insulation layer 105. For example, the lower surface 123a of the third dam 123 may be formed to be at a vertical level lower than that of the upper surface 105a of the field insulation layer 105. In some embodiments, the lower surface 123a of the third dam 123 may be substantially planar. For example, the lower surface 123a of the third dam 123 may be parallel to an upper surface of the substrate 100. In example embodiments, the field insulation layer 105 may contact the part of the side wall of the third dam 123.

A fourth dam 124 may be disposed on the field insulation layer 105 between the third active pattern F3 and the fifth active pattern F5. For example, the fourth dam 124 may include two dams spaced apart from each other in the first direction DR1. Each of the fourth dams 124 may separate each of the first and second gate electrodes G1 and G2 in the second direction DR2. A part of the side wall of the fourth dam 124 may be surrounded by the field insulation layer 105. For example, a lower surface 124a of the fourth dam 124 may be formed to be at a vertical level lower than that of the upper surface 105a of the field insulation layer 105. In some embodiments, the lower surface 124a of the fourth dam 124 may be substantially planar. For example, the lower surface 124a of the fourth dam 124 may be parallel to an upper surface of the substrate 100. In example embodiments, the field insulation layer 105 may contact the part of the side wall of the fourth dam 124.

A fifth dam 125 may be disposed on the field insulation layer 105 between the fourth active pattern F4 and the fifth active pattern F5. The fifth dam 125 may separate the fourth gate electrode G4 in the second direction DR2. A part of the side wall of the fifth dam 125 may be surrounded by the field insulation layer 105. For example, a lower surface of the fifth dam 125 may be formed to be at a vertical level lower than that of the upper surface 105a of the field insulation layer 105. In some embodiments, the lower surface of the fifth dam 125 may be substantially planar. For example, the lower surface of the fifth dam 125 may be parallel to an upper surface of the substrate 100. In example embodiments, the field insulation layer 105 may contact the part of the side wall of the fifth dam 125.

In some embodiments, one or more of the lower surface 122a of the second dam 122, the lower surface 123a of the third dam 123, the lower surface 124a of the fourth dam 124, and the lower surface of the fifth dam 125 may be at the same vertical level.

For example, a width W1 of the second dam 122 in the second direction DR2 may be greater than a width W2 of the fourth dam 124 in the second direction DR2. Further, the width W1 of the second dam 122 in the second direction DR2 may be greater than each of the width of the first dam 121 in the second direction DR2 and the width of the fifth dam 125 in the second direction DR2. Also, the width W1 of the second dam 122 in the second direction DR2 may be smaller than the width of the third dam 123 in the second direction DR2.

Each of the first to fifth dams 121 to 125 may include, for example, one of silicon nitride (SiN), silicon oxynitride (SiON), silicon carbonitride (SiCN), silicon oxycarbonitride (SiOCN), silicon carbide (SiC) or combinations thereof. In some other embodiments, each of the first to fifth dams 121 to 125 may include at least one of high dielectric constant materials having a higher dielectric constant than silicon oxide ($SiO_2$). The high dielectric constant materials may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

A first gate cut 131 may extend lengthwise in the first direction DR1 between the first active pattern F1 and the second active pattern F2. The first gate cut 131 may be disposed on the upper surface of the first dam 121. The width of the first gate cut 131 in the second direction DR2 may be greater than the width of the first dam 121 in the second direction DR2.

The first gate cut 131 may intersect each of the first to fourth gate electrodes G1 to G4. Each of the first to fourth gate electrodes G1 to G4 may be separated by the first gate cut 131 and the first dam 121.

The second gate cut 132 may extend lengthwise in the first direction DR1 between the second active pattern F2 and the third active pattern F3, and between the second active pattern F2 and the fourth active pattern F4. The second gate cut 132 may be spaced apart from each of a first side wall F3_s1 of the third active pattern F3 and a first side wall F4_s1 of the fourth active pattern F4 in the second direction DR2. The second gate cut 132 may be formed inside a gate cut trench GCT. The second gate cut 132 may be disposed on the upper surface of the second dam 122 and the upper surface of the third dam 123. For example, a lower surface of the second gate cut 132 may contact the upper surface of the second dam 122 and the upper surface of the third dam 123. A width W3 of the second gate cut 132 in the second direction DR2 may be the same as the width W1 of the second dam 122 in the second direction DR2. However, the present disclosure is not limited thereto.

The second gate cut 132 may intersect each of the first to fourth gate electrodes G1 to G4. Each of the first, second, and fourth gate electrodes G1, G2, and G4 may be separated by the second gate cut 132 and the second dam 122. Also, the third gate electrode G3 may be separated by the second gate cut 132 and the third dam 123.

A third gate cut 133 may extend lengthwise in the first direction DR1 between the third active pattern F3 and the fifth active pattern F5. The third gate cut 133 may be spaced apart from a second side wall F3_s2 opposite to the first side wall F3_s1 of the third active pattern F3 in the second direction DR2. The third gate cut 133 may be formed inside a gate cut trench GCT. The third gate cut 133 may be disposed on the upper surface of the fourth dam 124. For example, a lower surface of the third gate cut 133 may contact the upper surface of the fourth dam 124. A width W4 of the third gate cut 133 in the second direction DR2 may be greater than the width W2 of the fourth dam 124 in the second direction DR2.

The third gate cut 133 may intersect each of the first and second gate electrodes G1 and G2. Each of the first and second gate electrodes G1 and G2 may be separated by the third gate cut 133 and the fourth dam 124.

A fourth gate cut 134 may extend lengthwise in the first direction DR1 between the fourth active pattern F4 and the fifth active pattern F5. The fourth gate cut 134 may be spaced apart from a second side wall F4_s2 opposite to the first side wall F4_s1 of the fourth active pattern F4 in the second direction DR2. The fourth gate cut 134 may be disposed on the upper surface of the fifth dam 125. For example, a lower surface of the fourth gate cut 134 may contact the upper surface of the fifth dam 125. A width of the fourth gate cut 134 in the second direction DR2 may be greater than the width of the fifth dam 125 in the second direction DR2. In some embodiments, the width of the fourth gate cut 134 in the second direction DR2 may be the same as the width W4 of the third gate cut 133 in the second direction DR2, and the width of the fifth dam 125 in the second direction DR2 may be the same as the width W2 of the fourth dam 124 in the second direction DR2.

The fourth gate cut 134 may intersect the fourth gate electrode G4. The fourth gate electrode G4 may be separated by the fourth gate cut 134 and the fifth dam 125.

Each of the first to fourth gate cuts 131 to 134 may include, for example, one of silicon nitride (SiN), silicon oxide (SiO$_2$), silicon oxynitride (SiON), silicon carbonitride (SiCN), silicon oxycarbonitride (SiOCN), silicon carbide (SiC) or combinations thereof. In some embodiments, the first to fourth gate cuts 131 to 134 may include materials different from those of the first to fifth dams 121 to 125. However, the present disclosure is not limited thereto.

The source/drain region 140 may be disposed at least on one side of each of the first to fourth gate electrodes G1 to G4 on each of the first to fifth active patterns F1 to F5. The source/drain region 140 may be in contact with the plurality of nanosheets NW. Although FIG. 4 shows that the upper surface of the source/drain region 140 is formed to be at a vertical level higher than that of the upper surface of the uppermost nanosheet of the plurality of nanosheets NW, the present disclosure is not limited thereto.

The gate spacer 111 may extend lengthwise in the second direction DR2 along each of the side walls of the first to fourth gate electrodes G1 to G4 on the uppermost nanosheet of the plurality of nanosheets NW. Each of the first to fourth gate electrodes G1 to G4 may be disposed inside a gate trench GT defined by a gate spacer 111 on the uppermost nanosheet of the plurality of nanosheets NW.

Further, the gate spacer 111 may extend in the second direction DR2 along each of the side walls of the first to fifth dams 121 to 125 and each of the side walls of the first to fourth gate electrodes G1 to G4 on the field insulation layer 105. Each of the first to fourth gate electrodes G1 to G4 may be disposed inside the gate trench GT defined by the gate spacer 111 on the field insulation layer 105. In some embodiments, the gate spacer 111 may contact each of the side walls of the first to fifth dams 121 to 125.

The gate spacer 111 may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof.

An internal spacer 114 may be disposed on both sides of each of the first to fourth gate electrodes G1 to G4 between the plurality of nanosheets. Further, the internal spacers 114 may be disposed on both sides of each of the first to fourth gate electrodes G1 to G4 between each of the first to fifth active patterns F1 to F5 and the lowermost nanosheets of the plurality of nanosheets NW. The internal spacer 114 may be disposed between the source/drain region 140 and each of the first to fourth gate electrodes G1 to G4. In some other embodiments, the internal spacer 114 may be omitted.

The internal spacer 114 may be in contact with the source/drain region 140. Although FIG. 4 shows that the side wall of the internal spacer 114 being in contact with the source/drain region 140 is formed to be indented from the side wall of the gate spacer 111 being in contact with the first interlayer insulating film 150, the present disclosure is not limited thereto.

The internal spacer 114 may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof. However, the present disclosure is not limited thereto.

The gate insulation layer 112 may be disposed between each of the first to fourth gate electrodes G1 to G4 and the plurality of nanosheets NW. The gate insulation layer 112 may be disposed between each of the first to fourth gate electrodes G1 to G4 and the gate spacer 111. The gate insulation layer 112 may be disposed between each of the first to fourth gate electrodes G1 to G4 and the internal spacer 114. The gate insulation layer 112 may be disposed between each of the first to fourth gate electrodes G1 to G4 and each of the first to fifth active patterns F1 to F5. The gate insulation layer 112 may be disposed between each of the first to fourth gate electrodes G1 to G4 and the field insulation layer 105.

Further, the gate insulation layer 112 may be disposed between each of the first to fourth gate electrodes G1 to G4 and the first to fifth dams 121 to 125. The gate insulation layer 112 may be disposed between each of the first to fourth gate electrodes G1 to G4 and each of the first to fourth gate cuts 131 to 134. In example embodiments, the gate insulation layer 112 may contact each of the first to fourth gate electrodes G1 to G4 and each of the first to fourth gate cuts 131 to 134.

The gate insulation layer 112 may include at least one of silicon oxide, silicon oxynitride, silicon nitride, or a high dielectric constant material having a dielectric constant higher than silicon oxide. The high dielectric constant material may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The semiconductor device according to some other embodiments may include an NC (Negative Capacitance) FET that uses a negative capacitor. For example, the first gate insulation layer 112 may include a ferroelectric material film having ferroelectric properties, and a paraelectric material film having the paraelectric properties.

The ferroelectric material film may have a negative capacitance, and the paraelectric material film may have a positive capacitance. For example, when two or more capacitors are connected in series, and the capacitance of each capacitor has a positive value, the entire capacitance decreases from the capacitance of each individual capacitor. On the other hand, when at least one of the capacitances of two or more capacitors connected in series has a negative value, the entire capacitance may be greater than an absolute value of each individual capacitance, while having a positive value.

When the ferroelectric material film having the negative capacitance and the paraelectric material film having the positive capacitance are connected in series, the entire capacitance values of the ferroelectric material film and the paraelectric material film connected in series may increase. A transistor including the ferroelectric material film may have a subthreshold swing (SS) below 60 mV/decade at room temperature, using the increased overall capacitance value.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have paraelectric properties. The paraelectric material film may include at least one of, for example, silicon oxide and metal oxide having a high dielectric constant. The metal oxide included in the paraelectric material film may include, for example, but is not limited to, at least one of hafnium oxide, zirconium oxide, and aluminum oxide.

The ferroelectric material film and the paraelectric material film may include the same material. The ferroelectric material film has the ferroelectric properties, but the paraelectric material film may not have the ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. A thickness of the ferroelectric material film may be, but is not limited to, for example, 0.5 to 10 nm. Since a critical thickness that exhibits the ferroelectric properties may vary for each ferroelectric material, the thickness of the ferroelectric material film may vary depending on the ferroelectric material.

As an example, the gate insulation layer 112 may include a single ferroelectric material film. As another example, the gate insulation layer 112 may include a plurality of ferroelectric material films spaced apart from each other. The gate insulation layer 112 may have a stacked film structure in which a plurality of ferroelectric material films and a plurality of paraelectric material films are alternately stacked.

The capping pattern 113 may be disposed on each of the first to fourth gate electrodes G1 to G4. The capping pattern 113 may surround the side walls of each of the first to fourth gate cuts 131 to 134. For example, the upper surface of the capping pattern 113 may be formed on the same plane as the upper surfaces of each of the first to fourth gate cuts 131 to 134.

The capping pattern 113 may include, for example, at least one of silicon nitride (SiN), silicon oxynitride (SiON), silicon oxide (SiO$_2$), silicon carbonitride (SiCN), silicon oxycarbonitride (SiOCN), and combinations thereof.

The first interlayer insulating film 150 may be disposed to cover the gate spacer 111, the field insulation layer 105 and the source/drain region 140. The first interlayer insulating film 150 may include, for example, at least one of silicon oxide, silicon nitride, silicon oxynitride, and a low dielectric constant material. The low dielectric constant material may include, for example, but is not limited to, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica, or combinations thereof. However, the present disclosure is not limited thereto.

The second interlayer insulating film 155 may be disposed on the first interlayer insulating film 150, the upper surface of the gate spacer 111 and the upper surface of the capping pattern 113. For example, although the second interlayer insulating film 155 may include the same material as that of the first interlayer insulating film 150, the present disclosure is not limited thereto.

The gate contact 160 penetrates the second interlayer insulating film 155 and the capping pattern 113 in the vertical direction DR3, and may be connected to at least one of the first to fourth gate electrodes G1 to G4. Although FIGS. 2 to 4 show that the gate contact 160 is formed of a single film, this is for convenience of explanation, and the present disclosure is not limited thereto. For example, the gate contact 160 may be formed of multi-films. The gate contact 160 may include a conductive material.

An etching stop film 170 may be disposed on the second interlayer insulating film 155. The etching stop film 170 may cover a part of the upper surface of the gate contact 160. Although FIGS. 2 to 4 show that the etching stop film 170 is formed of a single film, the present disclosure is not limited thereto. In some other embodiments, the etching stop film 170 may be formed of a multi-film. The etching stop film 170 may include, for example, at least one of silicon oxide, silicon nitride, silicon oxynitride and a low dielectric constant material.

The third interlayer insulating film 175 may be disposed on the etching stop film 170. The third interlayer insulating film 175 may include, for example, at least one of silicon oxide, silicon nitride, silicon oxynitride, and a low dielectric constant material.

The via 180 may penetrate the third interlayer insulating film 175 and the etching stop film 170 in the vertical direction DR3 and be connected to the gate contact 160. For example, a lower surface of the via 180 may contact an upper surface of the gate contact 160. FIGS. 2 to 4 show that the via 180 is formed of a single film, this is for convenience of explanation, and the present disclosure is limited thereto. For example, the via 180 may be formed of a multi-film. The via 180 may include a conductive material.

Hereinafter, a method for fabricating a semiconductor device according to some example embodiments of the present disclosure will be described referring to FIGS. 5 to 31.

FIGS. 5 to 31 are intermediate stage diagrams for explaining a method for fabricating a semiconductor device according to some example embodiments of the present disclosure.

Figure 5:
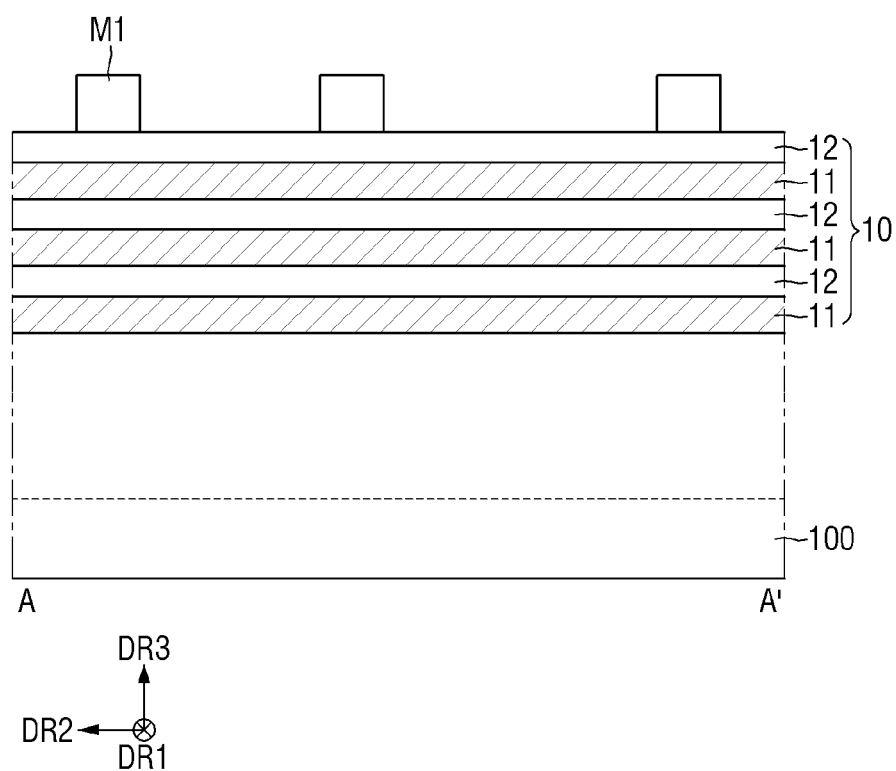
FIGS. 5 to 31 are intermediate stage diagrams for explaining a method for fabricating a semiconductor device, according to some example embodiments of the present disclosure.
Figure 6:
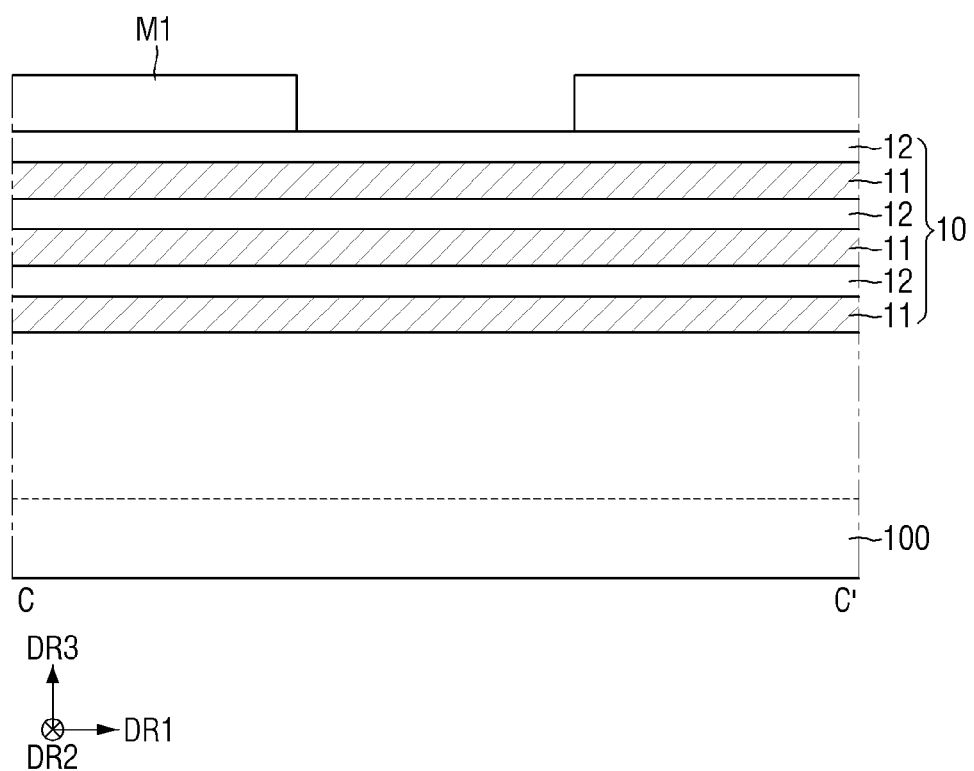

Referring to FIGS. 5 and 6, a stacked structure 10 in which the first semiconductor layers 11 and the second semiconductor layers 12 are alternately stacked may be formed on the substrate 100. For example, the first semiconductor layer 11 may be formed at the lowermost part of the stacked structure 10, and the second semiconductor layer 12 may be formed at the uppermost part of the stacked structure 10. However, the present disclosure is not limited thereto. The first semiconductor layers 11 may include, for example, silicon germanium (SiGe). The second semiconductor layers 12 may include, for example, silicon (Si). Subsequently, the first mask pattern M1 may be formed on the stacked structure.

Figure 7:
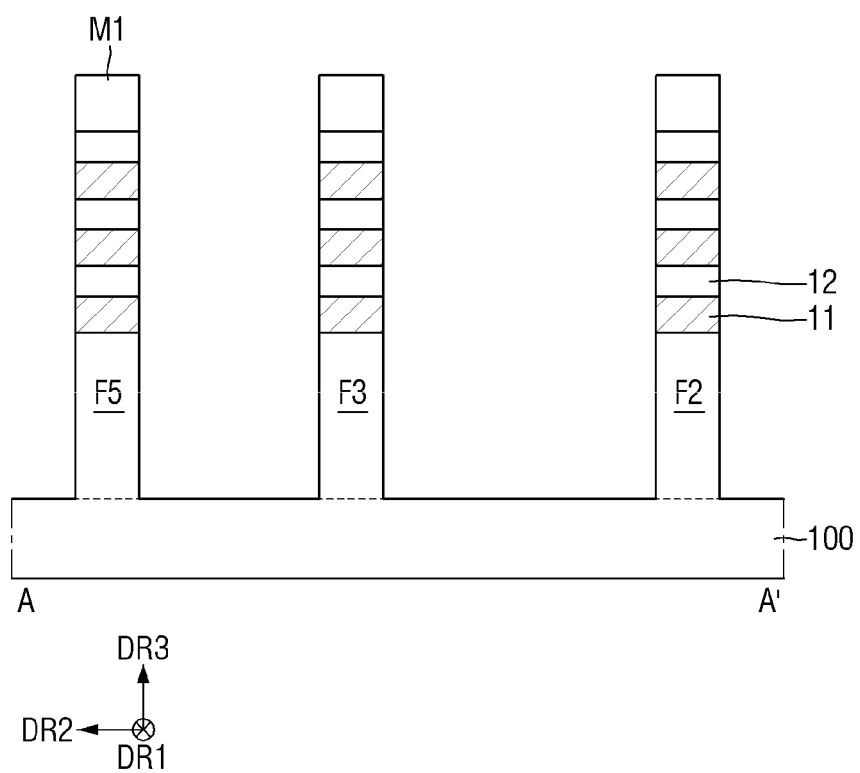
Figure 8:
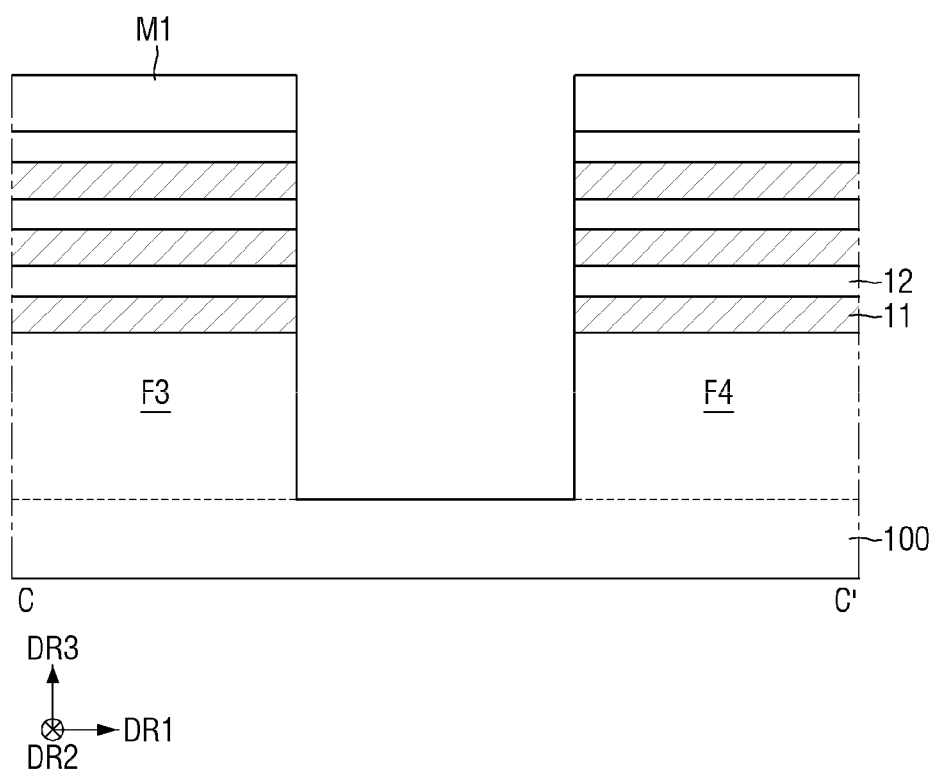

Referring to FIGS. 7 and 8, a part of the stacked structure 10 and the substrate 100 may be etched, using the first mask pattern M1 as a mask. The second to fifth active patterns F2 to F5 may be formed on the substrate 100 through the etching process. Each of the second to fifth active patterns F2 to F5 may extend in the first direction DR1.

Figure 9:
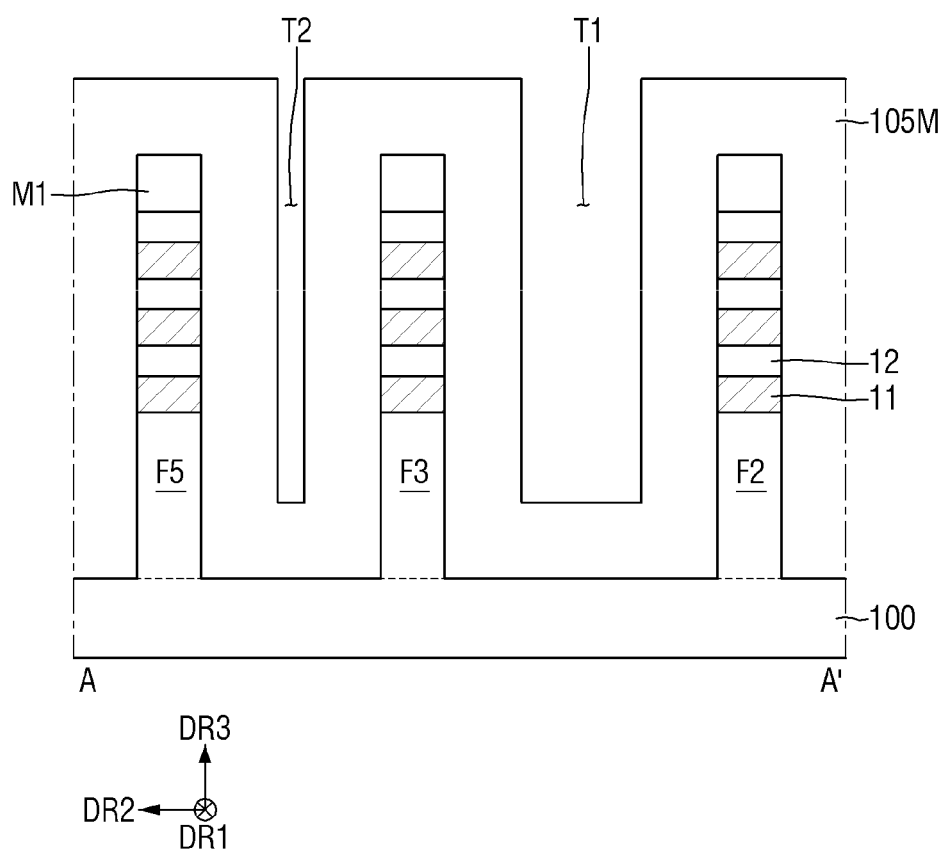
Figure 10:
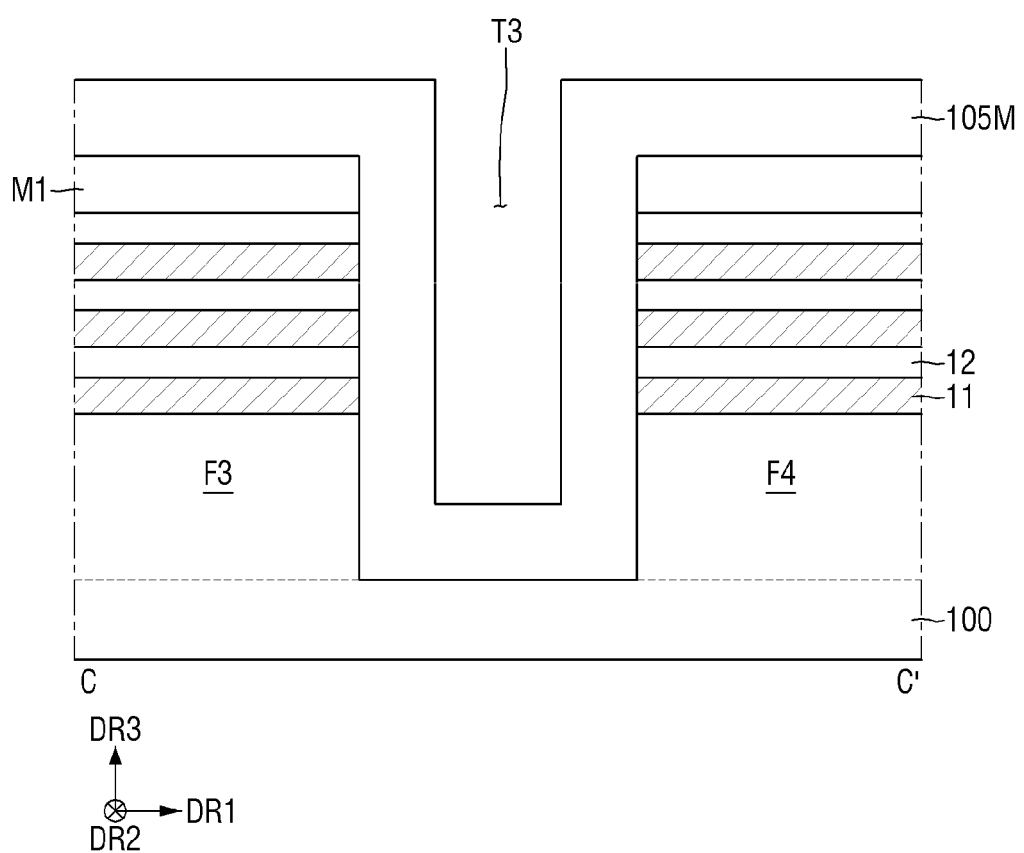

Referring to FIGS. 9 and 10, an insulating material layer 105M may be formed on the upper surface of the exposed substrate 100, the side walls of each of the second to fifth active patterns F2 to F5, the side walls of the first semiconductor layers 11, the side walls of the second semiconductor layers 12, and the first mask pattern M1. For example, the insulating material layer 105M may be conformally formed.

A first trench T1 may be defined between the second active pattern F2 and the third active pattern F3, a second trench T2 may be defined between the third active pattern F3 and the fifth active pattern F5, and a third trench T3 may be defined between the third active pattern F3 and the fourth active pattern F4, by the insulating material layer 105M. The insulating material layer 105M may include, for example, an oxide film, a nitride film, an oxynitride film or a combination film thereof.

Figure 11:
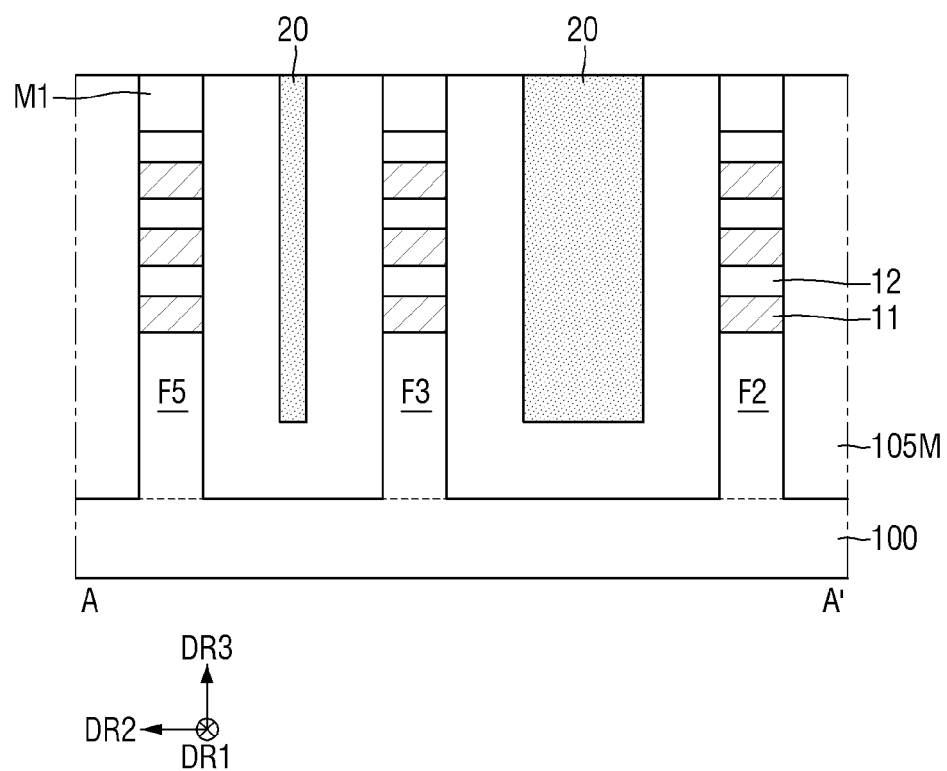
Figure 12:
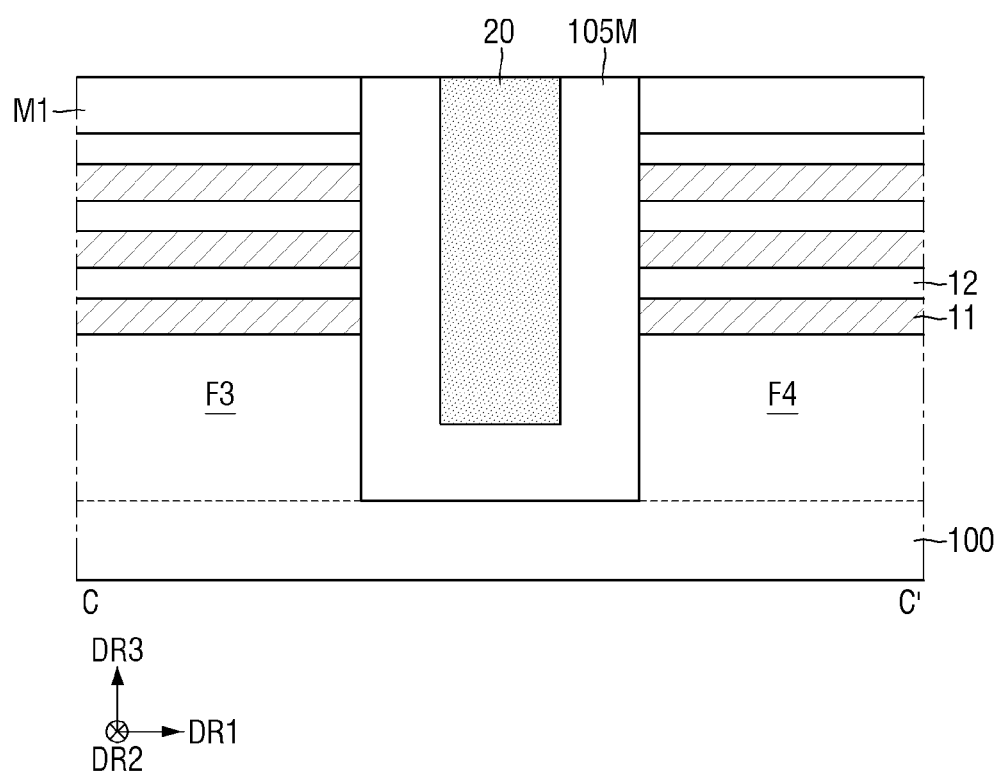

Referring to FIGS. 11 and 12, a sacrificial layer 20 may be formed inside each of the first to third trenches T1, T2, and T3. The sacrificial layer 20 may include, for example, silicon germanium (SiGe).

Subsequently, the insulating material layer 105M formed on the upper surface of the first mask pattern M1 may be removed through a flattening process (for example, a CMP process). The upper surface of the first mask pattern M1 and the upper surface of the sacrificial layer 20 may be formed on the same plane through the flattening process.

Figure 13:
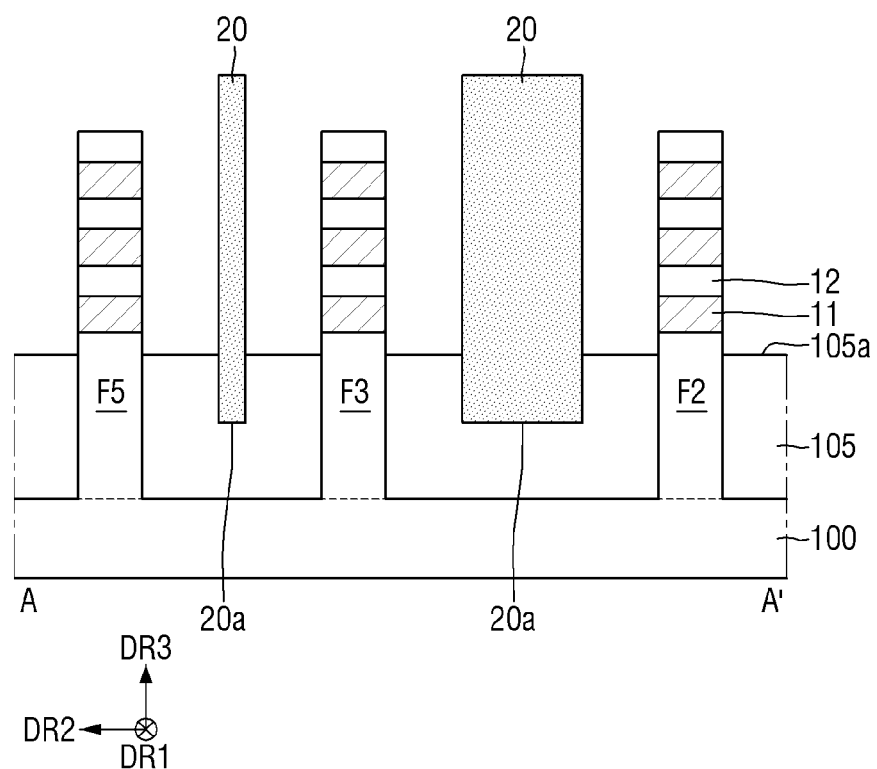
Figure 14:
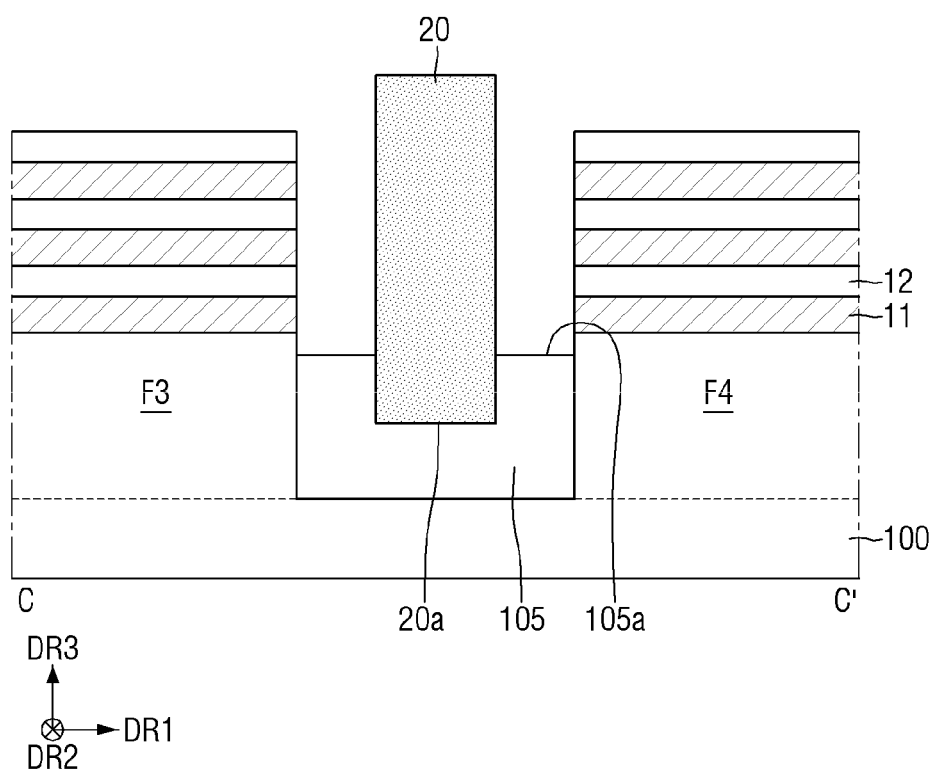

Referring to FIGS. 13 and 14, the first mask pattern M1 may be removed. Subsequently, a part of the insulating material layer 105M may be etched through an etch-back process to form the field insulation layer 105. The upper surface 105a of the field insulation layer 105 may be formed to be at a vertical level higher than that of the lower surface 20a of the sacrificial layer 20. For example, a part of each side wall of the second to fifth active patterns F2 to F5 may be exposed above the upper surface 105a of the field insulation layer 105.

Figure 15:
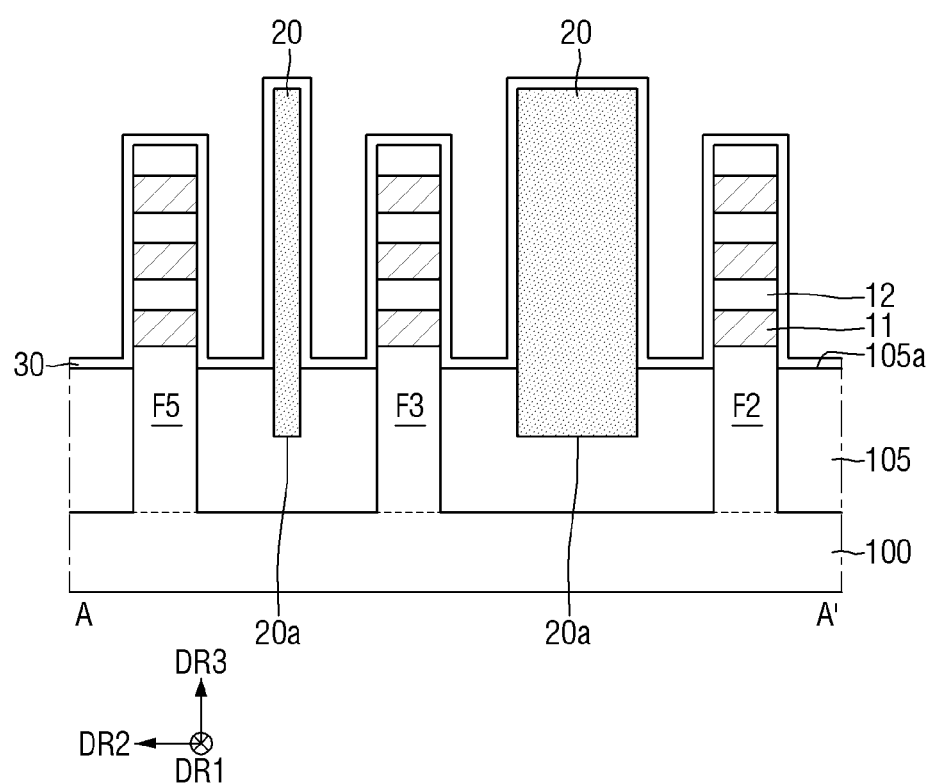
Figure 16:
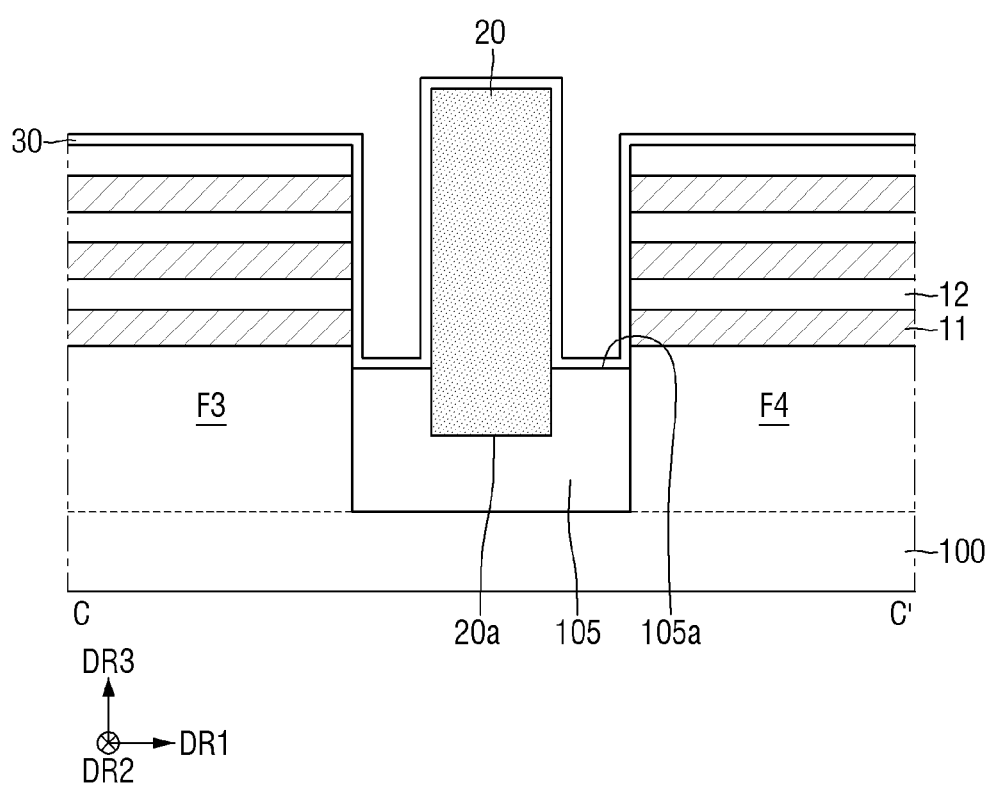

Referring to FIGS. 15 and 16, a liner layer 30 may be formed on the upper surface 105a of the field insulation layer 105, the side walls of each of the exposed second to fifth active patterns F2 to F5, the exposed first semiconductor layer 11, the exposed second semiconductor layer 12, and the exposed sacrificial layer 20. For example, the liner layer 30 may be conformally formed. The liner layer 30 may include an insulating material, for example, silicon oxide ($SiO_2$).

Figure 17:
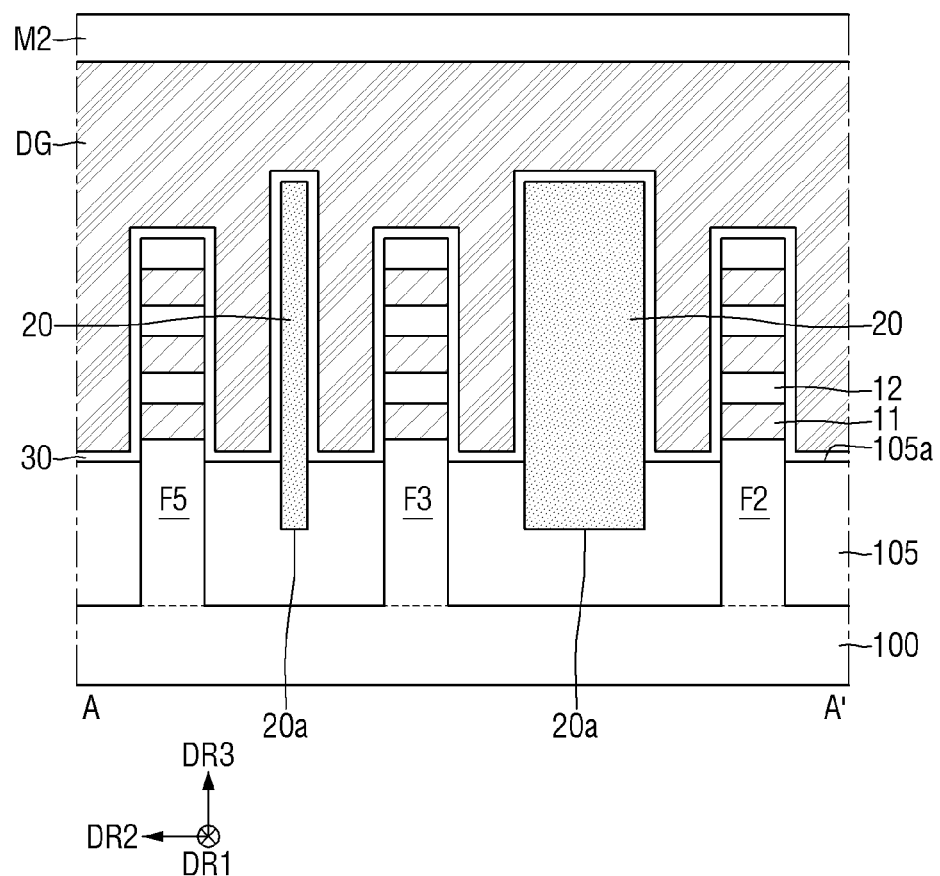
Figure 18:
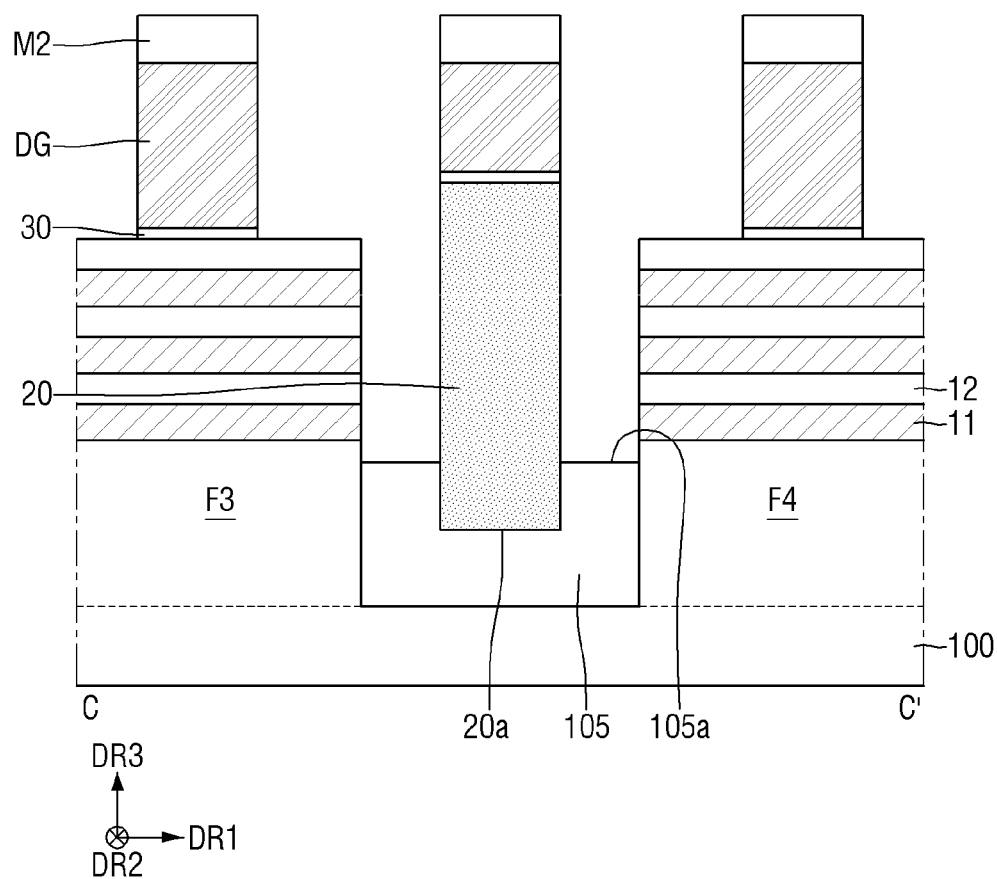

Referring to FIGS. 17 and 18, a dummy gate material layer and a second mask pattern M2 may be sequentially formed on the liner layer 30. Subsequently, the dummy gate material layer may be etched using the second mask pattern M2 as a mask to form a dummy gate DG.

The dummy gate DG may extend in the second direction DR2 on each of the second to fifth active patterns F2 to F5. Also, the dummy gate DG may be formed on the upper surface of the sacrificial layer 20 between the third active pattern F3 and the fourth active pattern F4. Subsequently, a portion of the liner layer 30 that does not overlap the dummy gate DG in the vertical direction DR3 may be removed.

Figure 19:
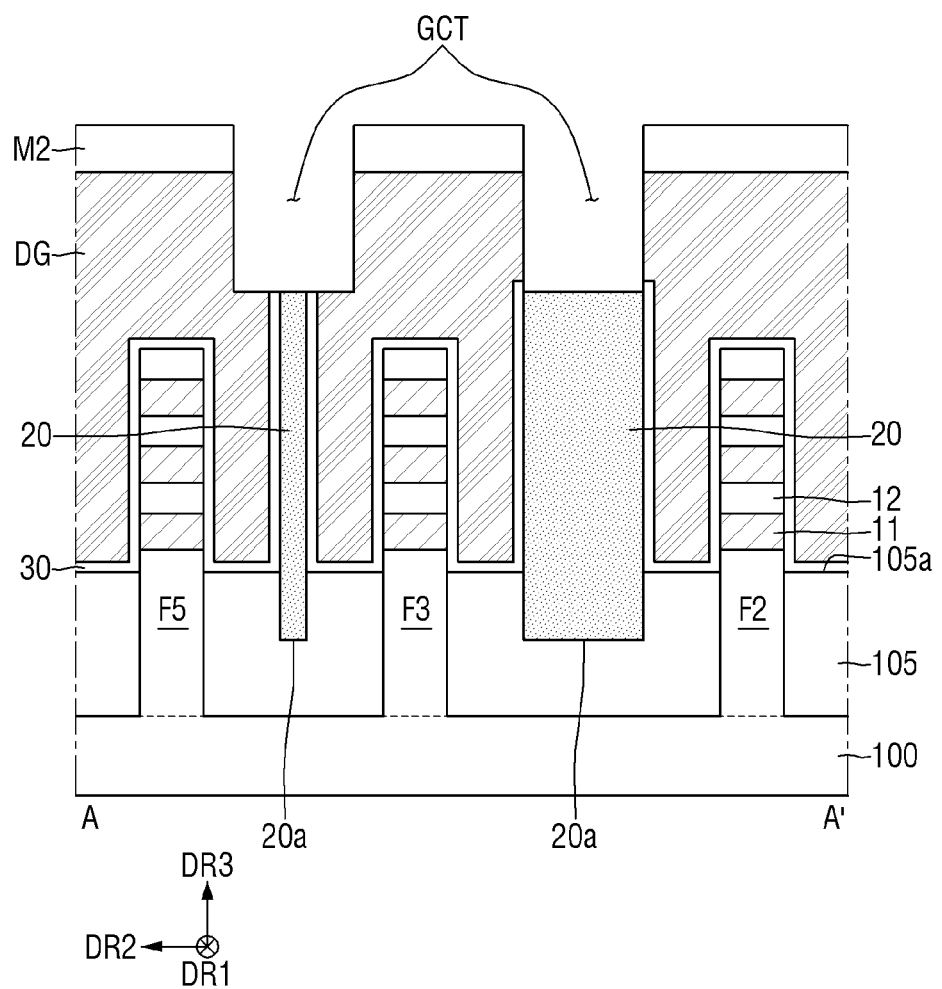

Referring to FIG. 19, the second mask pattern M2, the dummy gate DG, and the liner layer 30 may be etched between the second active pattern F2 and the third active pattern F3, and between the third active pattern F3 and the fifth active pattern F5, thereby forming a gate cut trench GCT. The sacrificial layer 20 formed between the second active pattern F2 and the third active pattern F3, and the sacrificial layer 20 formed between the third active pattern F3 and the fifth active pattern F5 may be exposed by the gate cut trench GCT.

Figure 20:
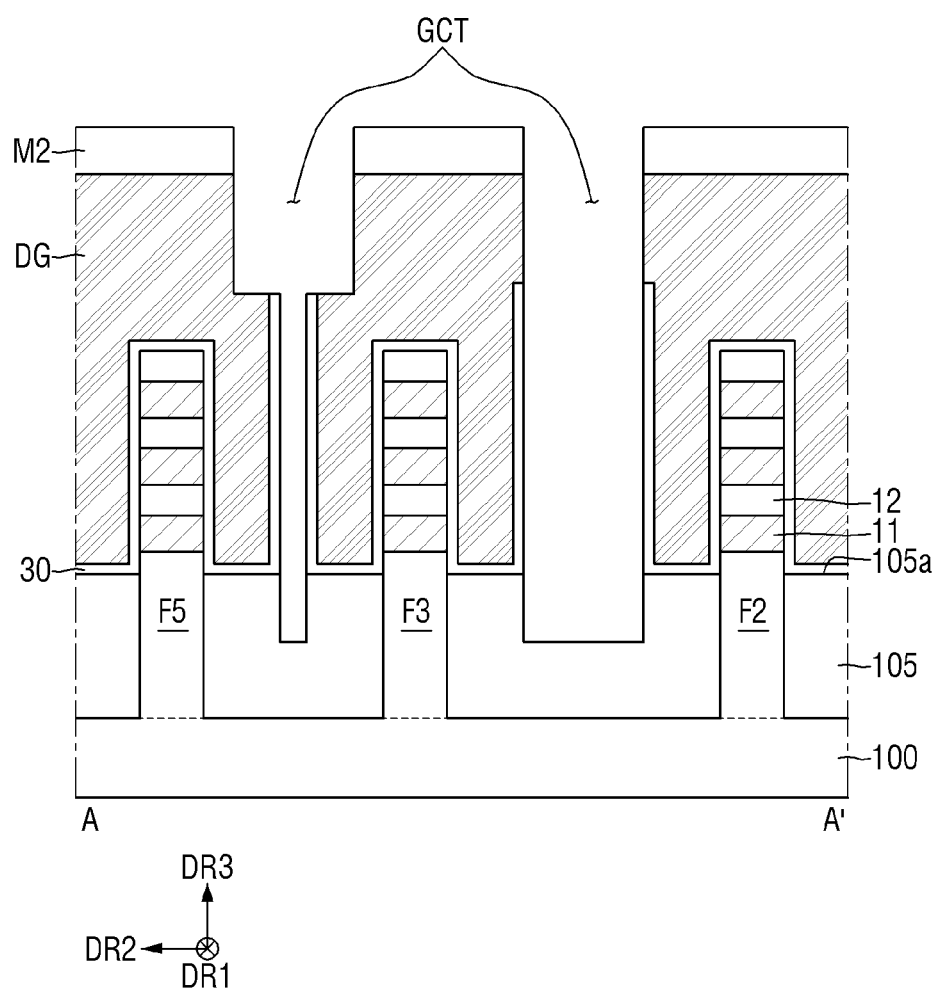

Referring to FIG. 20, the sacrificial layer 20 exposed by the gate cut trench GCT may be removed.

Figure 21:
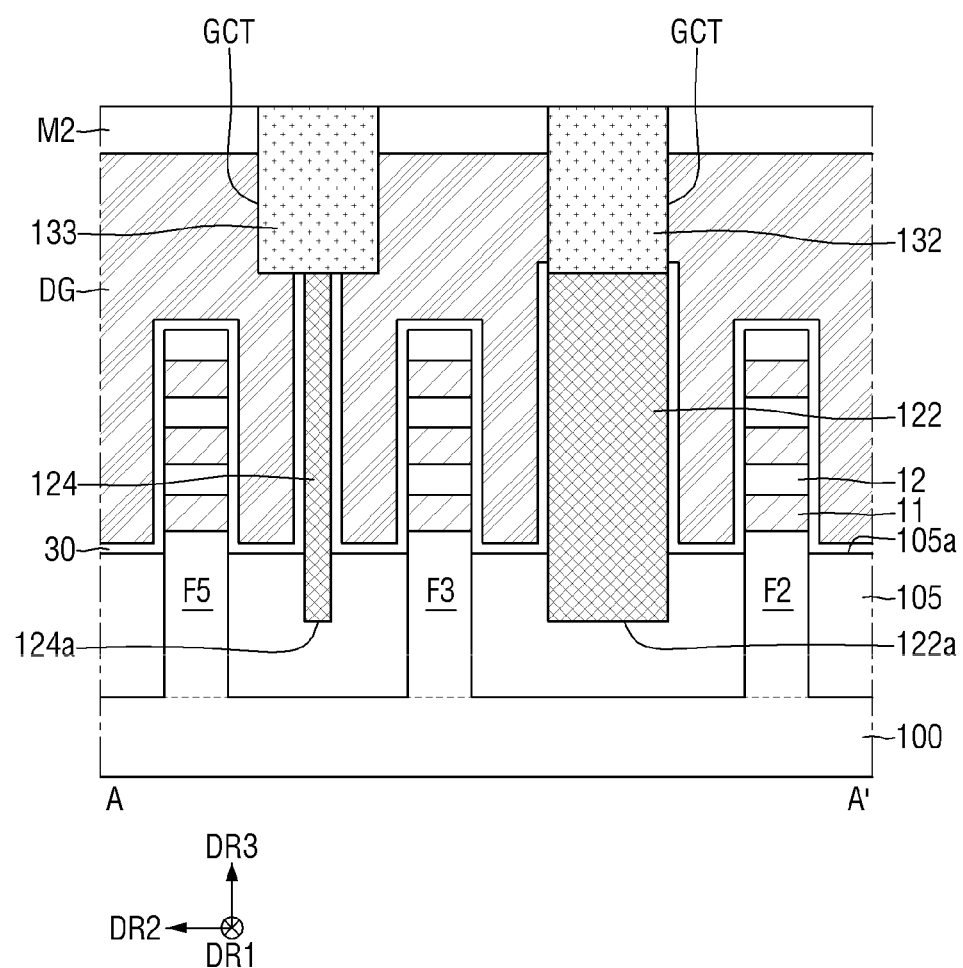
Figure 22:
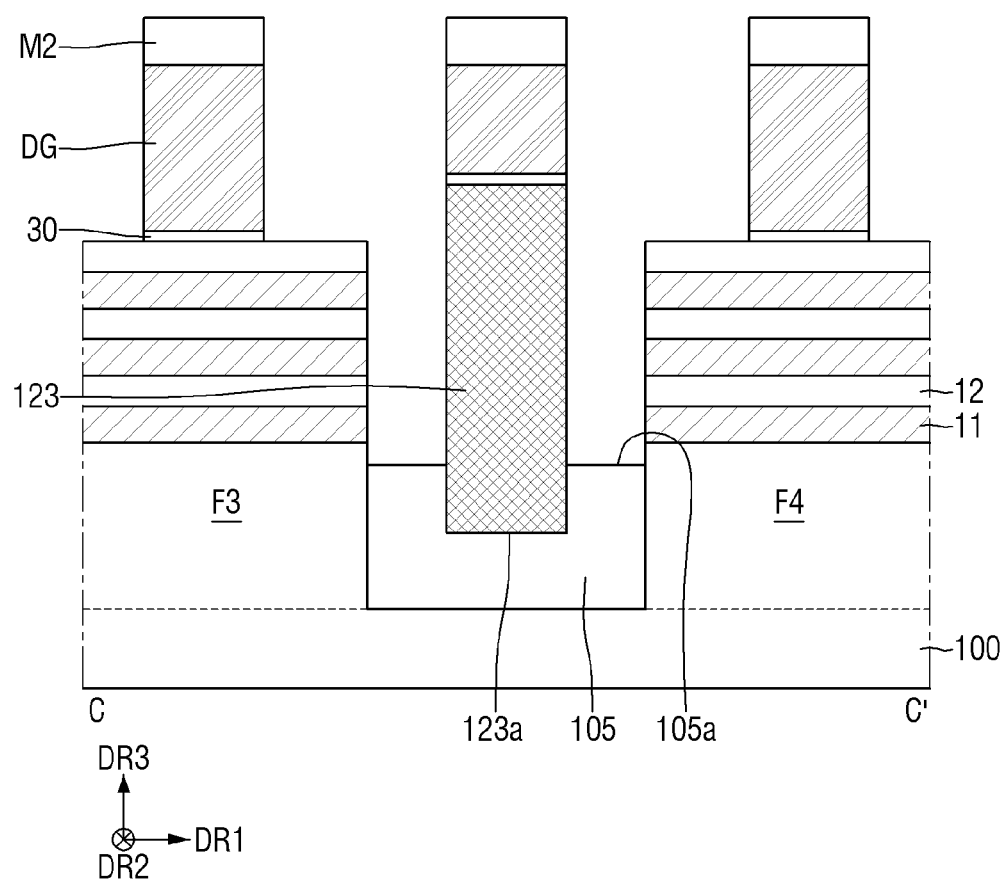

Referring to FIGS. 21 and 22, a second dam 122 may be formed in the portion in which the sacrificial layer 20 is removed between the second active pattern F2 and the third active pattern F3. Further, a fourth dam 124 may be formed in the portion in which the sacrificial layer 20 is removed between the third active pattern F3 and the fifth active pattern F5. Further, a third dam 123 may be formed in the portion in which the sacrificial layer 20 is removed between the third active pattern F3 and the fourth active pattern F4.

Subsequently, a second gate cut 132 and a third gate cut 133 may be formed inside the gate cut trench GCT. Specifically, the second gate cut 132 is formed inside the gate cut trench GCT formed on the second dam 122, and a third gate cut 133 may be formed inside the gate cut trench GCT formed on the fourth dam 124.

Figure 23:
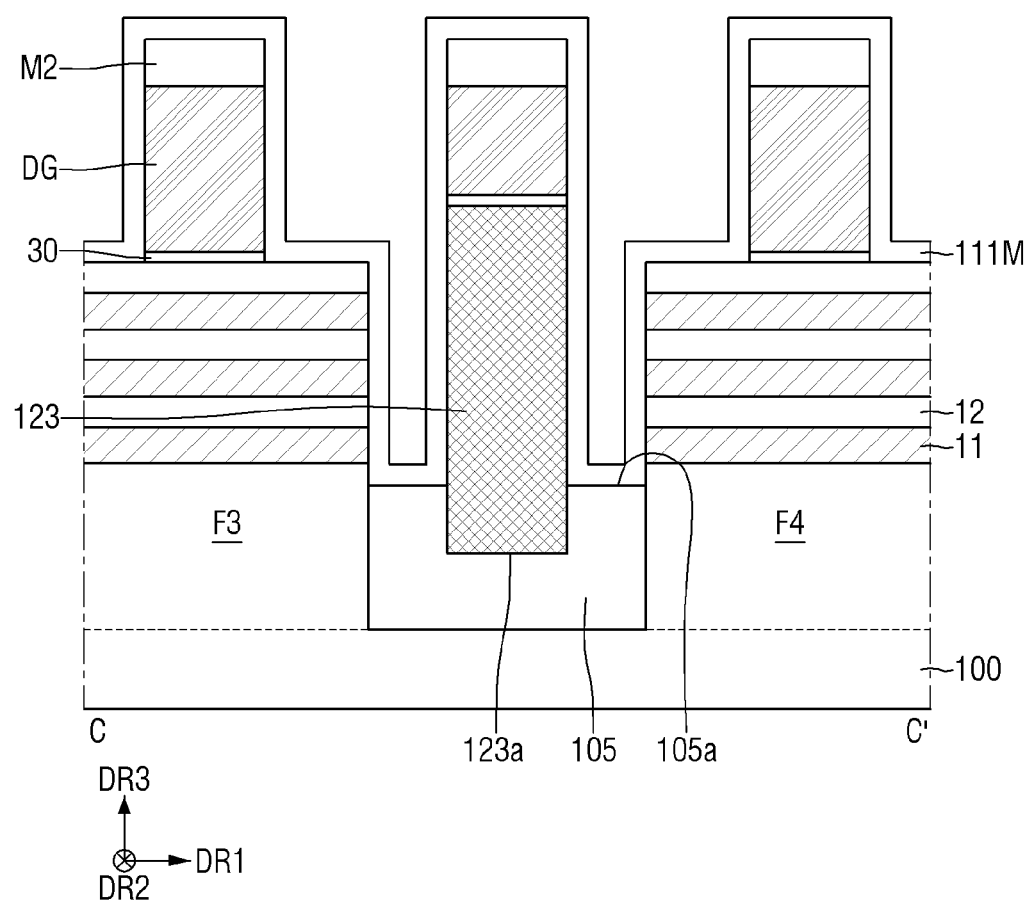

Referring to FIG. 23, a spacer material layer 111M may be formed on the upper surface 105a of the field insulation layer 105, the side walls of each of the exposed second to fourth active patterns F2 to F4, the exposed first semiconductor layers 11, the exposed second semiconductor layers 12, the exposed second to fourth dams 122, 123, and 124, the exposed dummy gate DG, and the second mask pattern M2.

Figure 24:
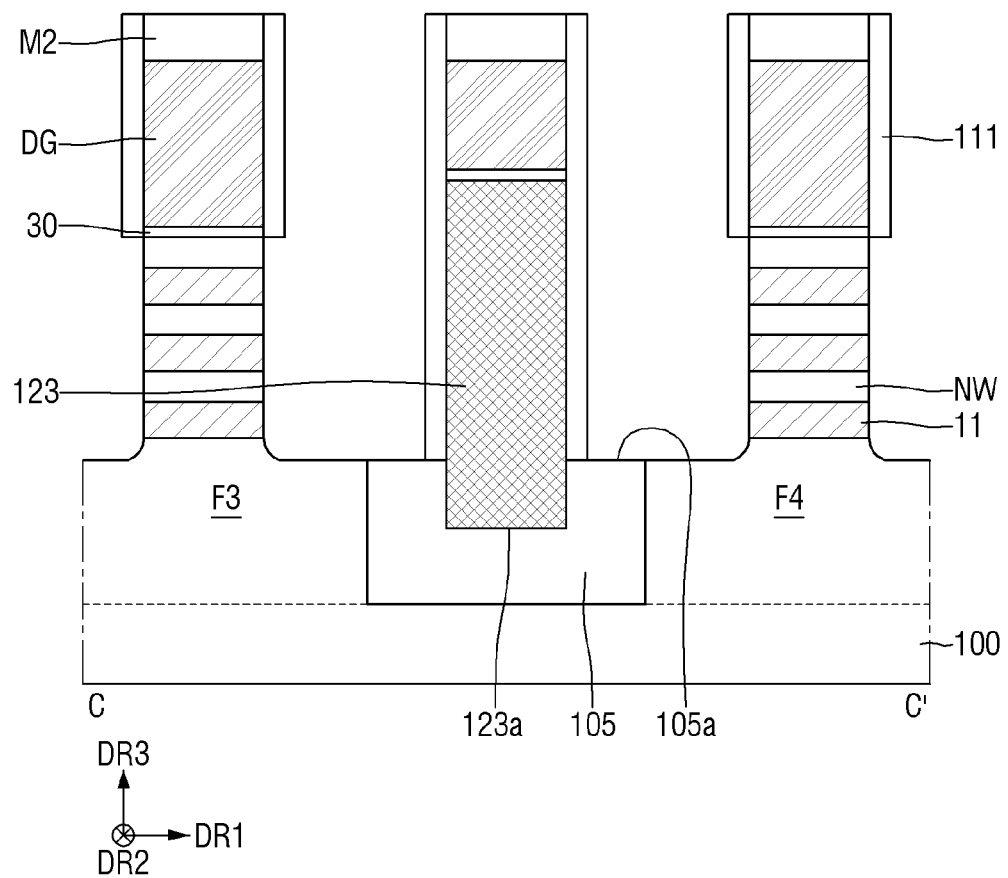

Referring to FIG. 24, the first semiconductor layers 11, the second semiconductor layers 12, a part of the third active pattern F3 formed on both sides of the dummy gate DG, and a part of the fourth active pattern F4 formed on both sides of the dummy gate DG may be etched through the etching process. While the etching process is performed, the upper surface of the second mask pattern M2 and the upper surface 105a of the field insulation layer 105 may be exposed, respectively. A gate spacer 111 may be formed on the side wall of the third dam 123, the side wall of the dummy gate DG, and the side wall of the second mask pattern M2 through the etching process.

Figure 25:
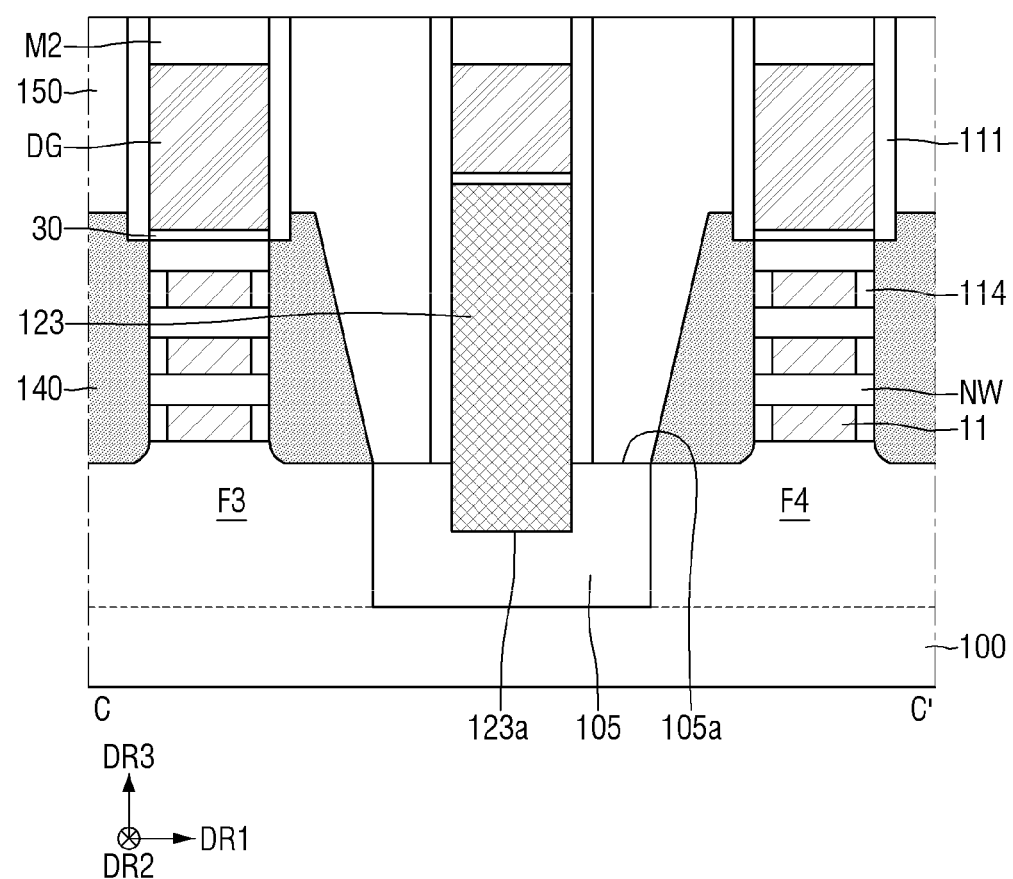

Referring to FIG. 25, a part of the side wall of each of the exposed second semiconductor layers 12 may be etched. Subsequently, an internal spacer 114 may be formed in the portion in which the second semiconductor layer 12 is etched.

Subsequently, source/drain regions 140 may be formed on both sides of the dummy gate DG in each of the third active pattern F3 and the fourth active pattern F4. Subsequently, the first interlayer insulating film 150 may be formed to cover the upper surface 105a of the field insulation layer 105, the gate spacer 111, and the source/drain region 140.

Figure 26:
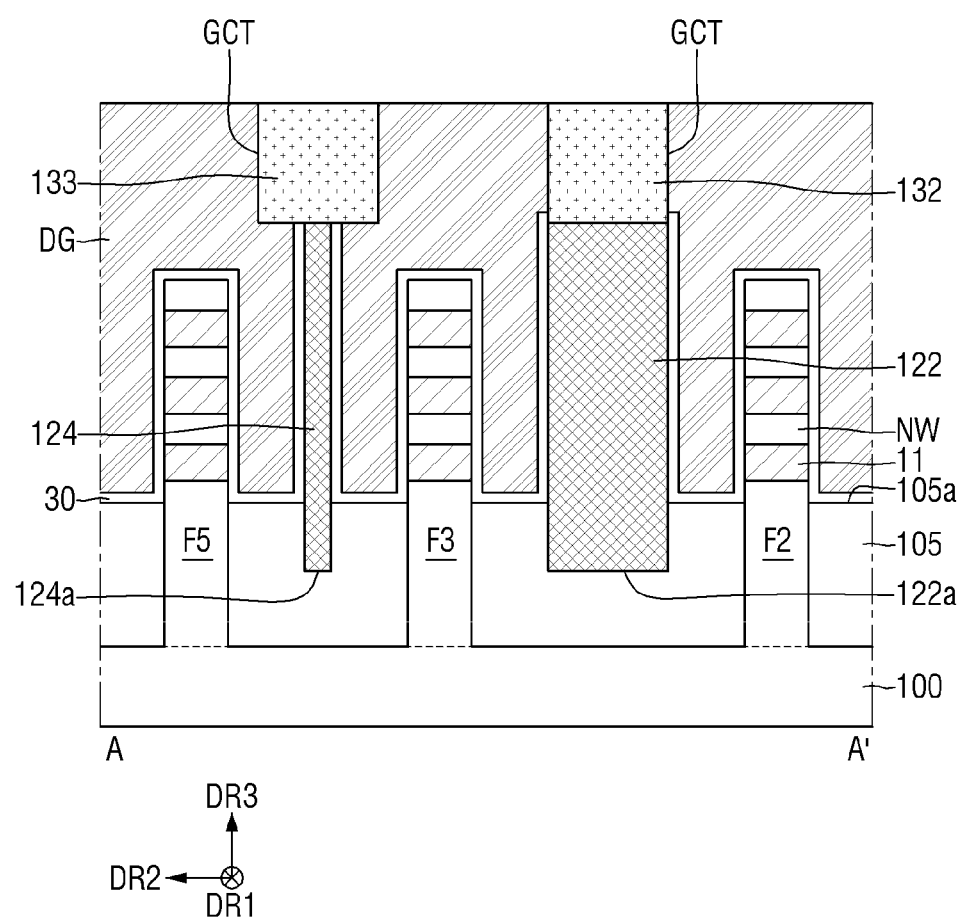
Figure 27:
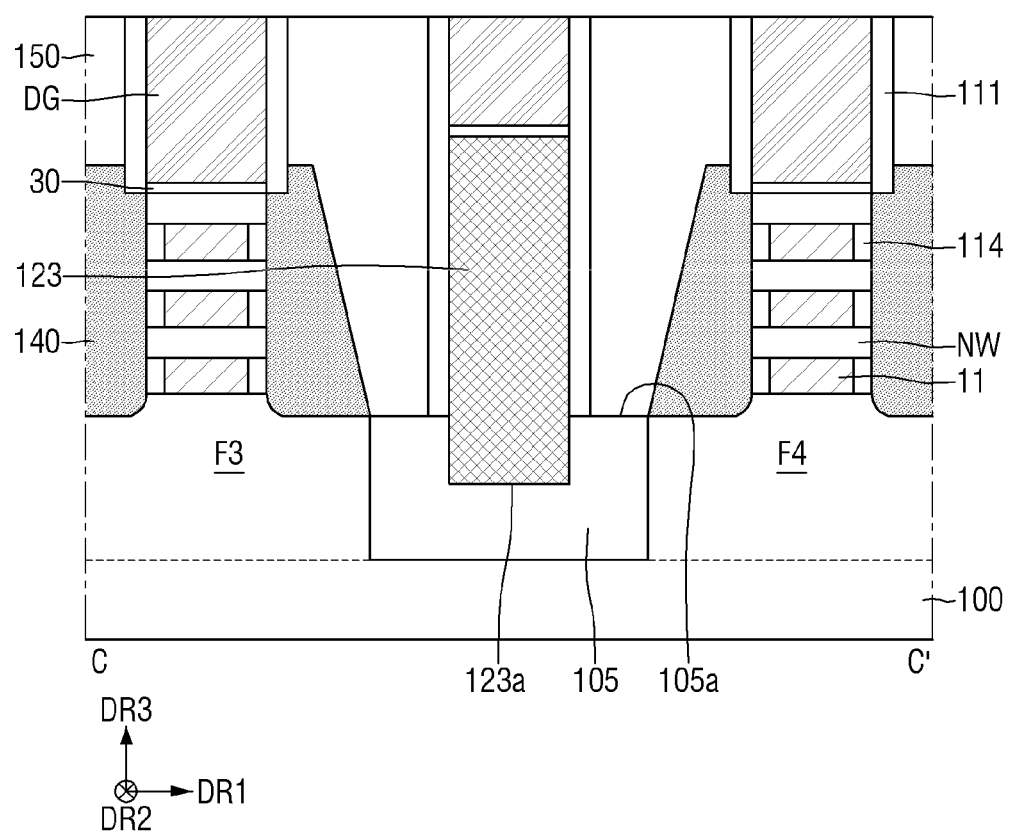

Referring to FIGS. 26 and 27, the second mask pattern M2, a part of the first interlayer insulating film 150, the second gate cut 132, and the third gate cut 133 may be removed through the flattening process. After the flattening process is performed, the dummy gate DG may be exposed.

Figure 28:
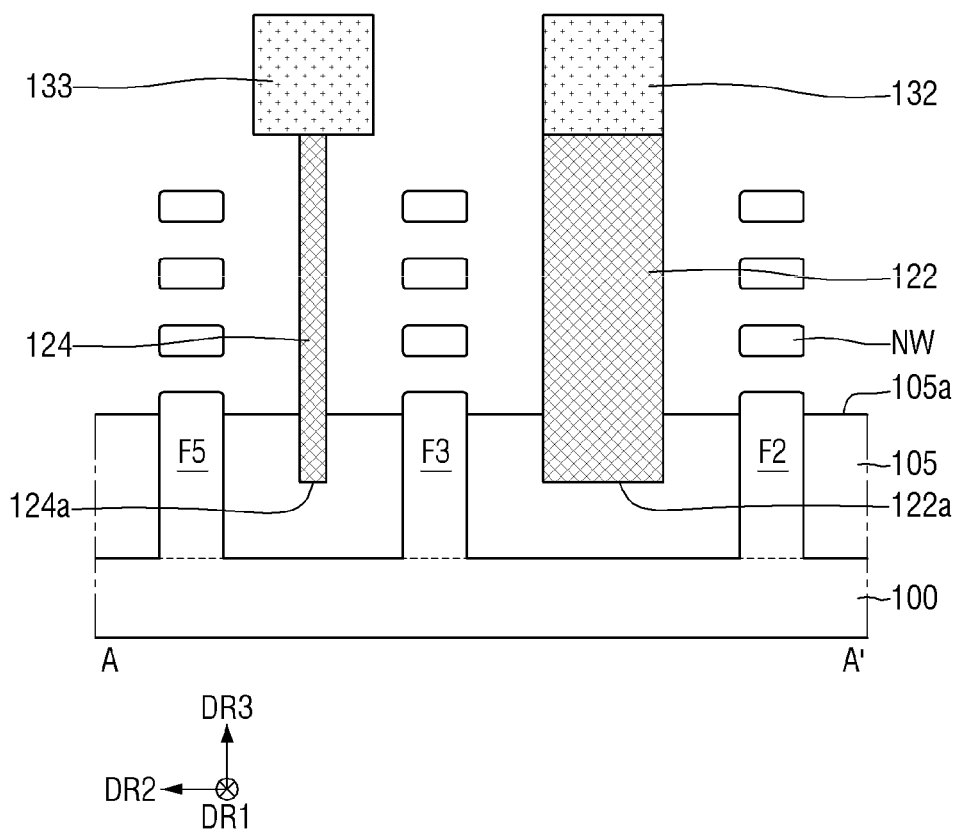
Figure 29:
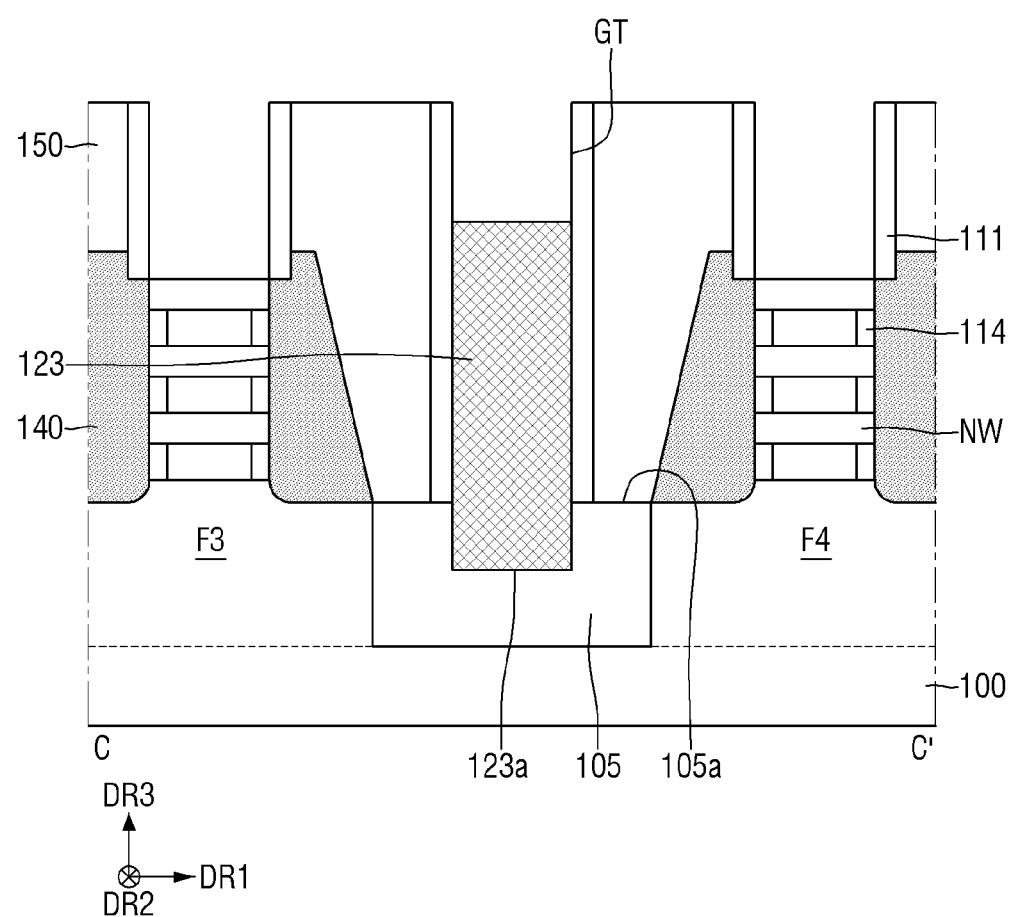

Referring to FIGS. 28 and 29, the dummy gate DG, the liner layer 30, and the first semiconductor layer 11 may be removed.

Figure 30:
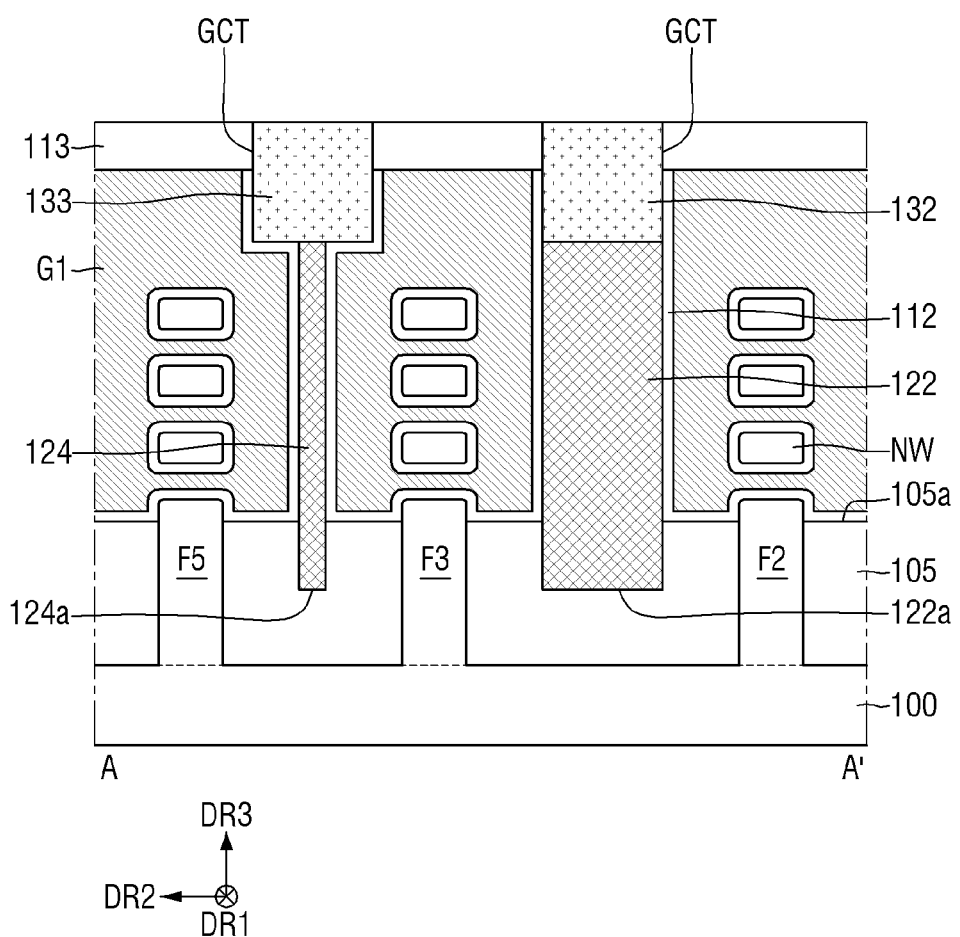
Figure 31:
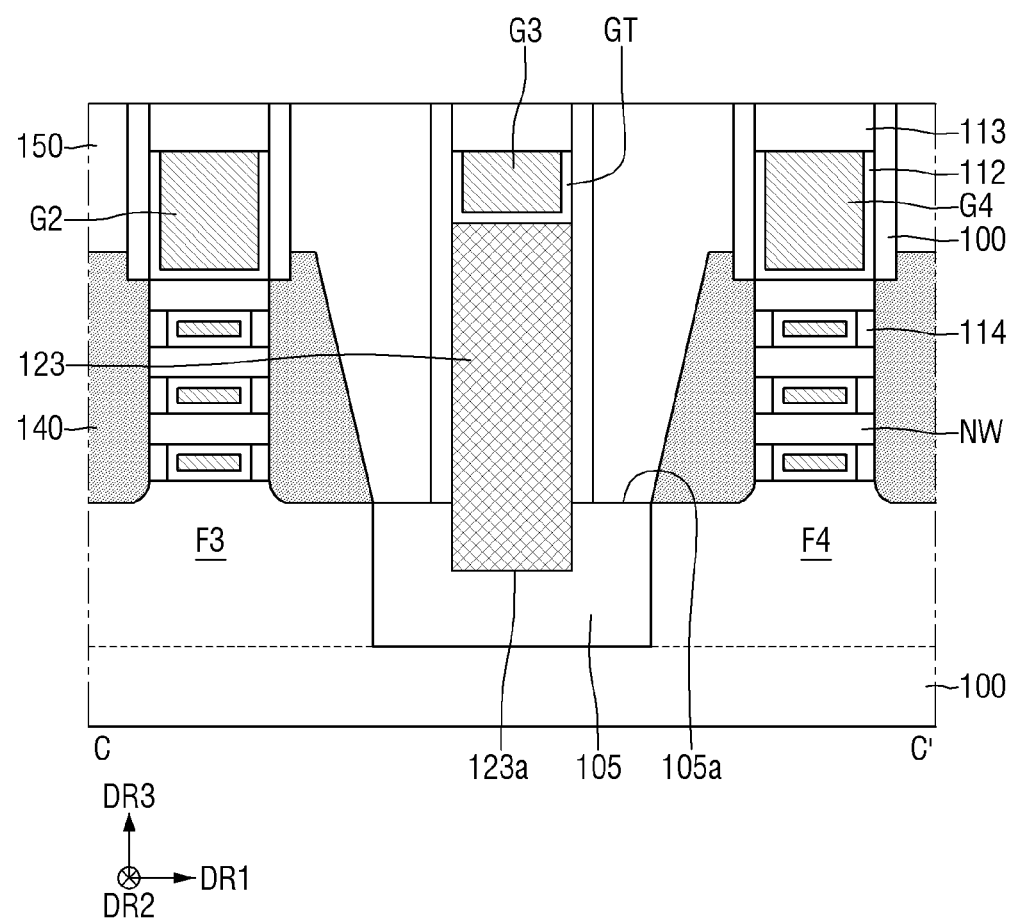

Referring to FIGS. 30 and 31, the gate insulation layer 112, the first to fourth gate electrodes G1 to G4, and the capping pattern 113 may be formed sequentially at the portion in which the dummy gate DG, the liner layer 30, and the first semiconductor layer 11 are removed.

Referring to FIGS. 2 to 4, after the second interlayer insulating film 155 is formed on the first interlayer insulating film 150, a gate contact 160 which penetrates the second interlayer insulating film 155 and the capping pattern 113 in the vertical direction DR3 may be formed. Subsequently, after the etching stop film 170 and the third interlayer insulating film 175 are sequentially formed on the second interlayer insulating film 155, a via 180 which penetrates the etching stop film 170 and the third interlayer insulating film 175 in the vertical direction DR3 may be formed.

In the semiconductor device and the method for fabricating the semiconductor device according to some embodiments of the present disclosure, since the gate cut is formed, using the sacrificial layer 20 having a lower surface formed to be at a vertical level lower than that of the upper surface 105a of the field insulation layer 105, by effectively separating the gate electrodes while maintaining the field insulation layer 105, it is possible to improve the reliability of the semiconductor device. In the semiconductor device and the method for fabricating the semiconductor device according to some embodiments of the present disclosure, the gate electrode may be formed on the third dam 123 in which the sacrificial layer 20 is redisposed, in the process of forming the gate cut by the use of the sacrificial layer 20. Further, the lower surface 123a of the third dam 123 formed on the lower surface of the gate electrode may be formed to be at a vertical level lower than that of the upper surface 105a of the field insulation layer 105.

Hereinafter, a method for fabricating a semiconductor device according to some other embodiments of the present disclosure will be described referring to FIGS. 32 to 40. Differences from the method for fabricating the semiconductor device shown in FIGS. 5 to 31 will be mainly described.

FIGS. 32 to 40 are intermediate stage diagrams for explaining a method for fabricating a semiconductor device according to some other embodiments of the present disclosure.

Figure 32:
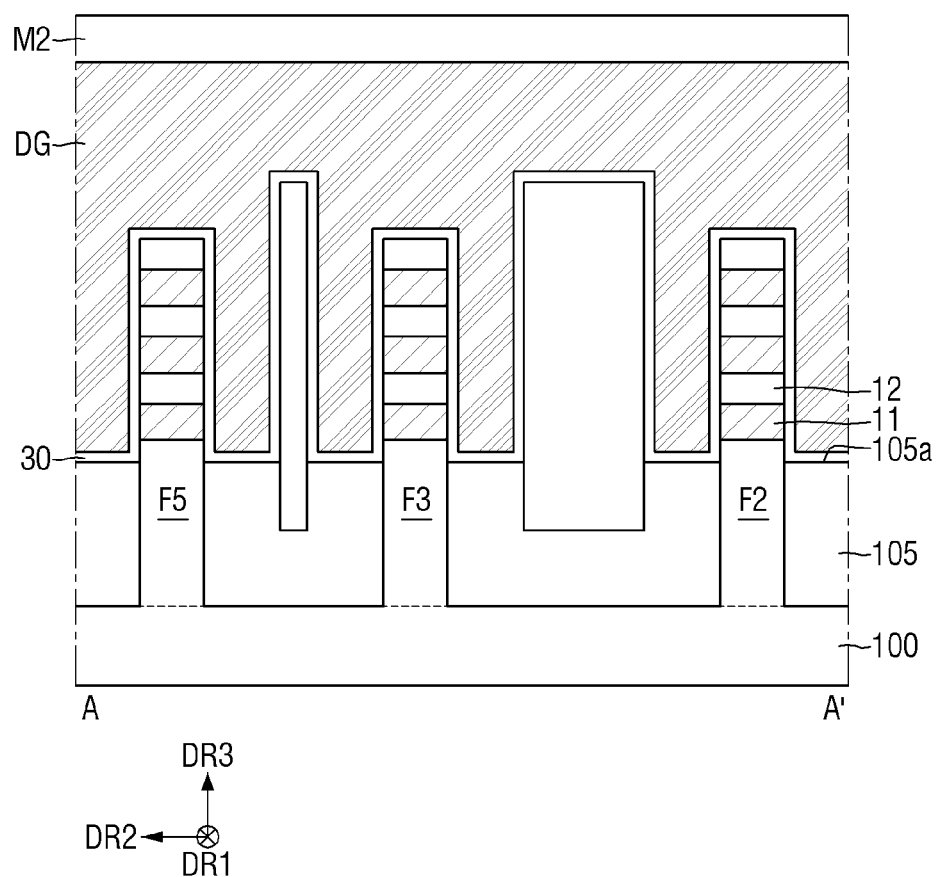
FIGS. 32 to 40 are intermediate stage diagrams for explaining a method for fabricating a semiconductor device, according to some other example embodiments of the present disclosure.
Figure 33:
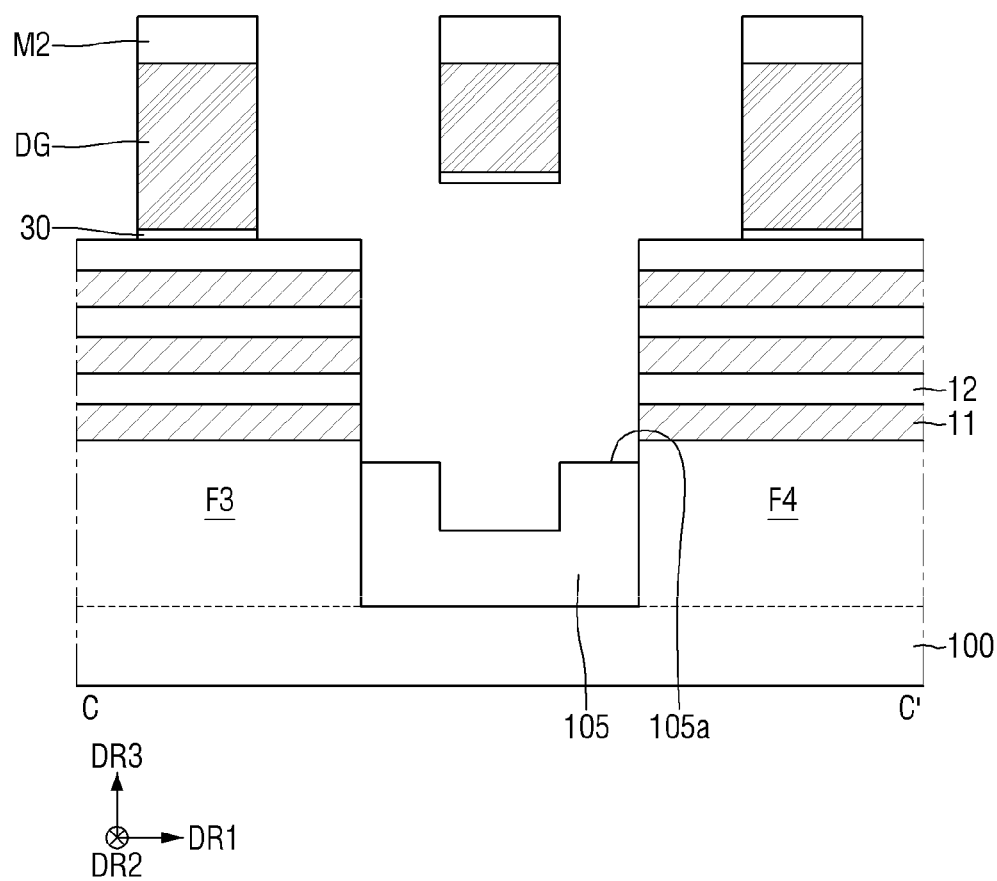

Referring to FIGS. 32 and 33, the sacrificial layer (e.g., sacrificial layer 20 of FIG. 17) may be removed after the processes shown in FIGS. 5 to 18 are performed. The sacrificial layer (e.g., sacrificial layer 20 of FIG. 17) may be removed through the side wall of the exposed dummy gate DG in the first direction DR1.

Figure 34:
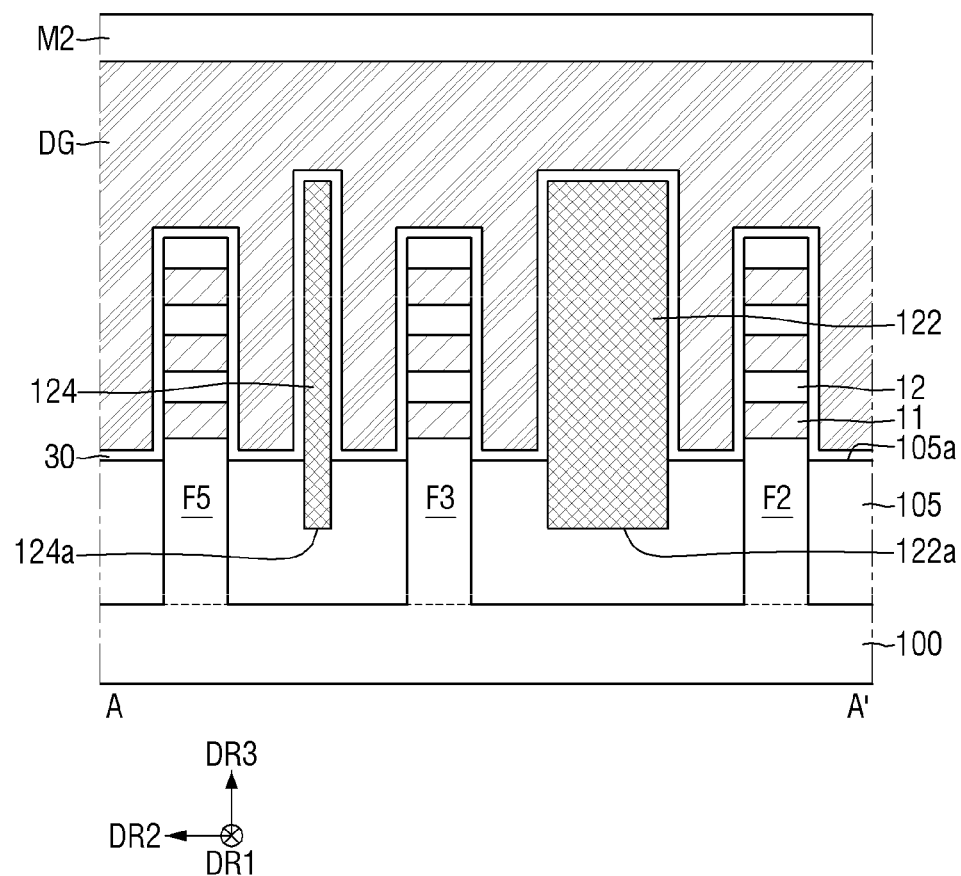
Figure 35:
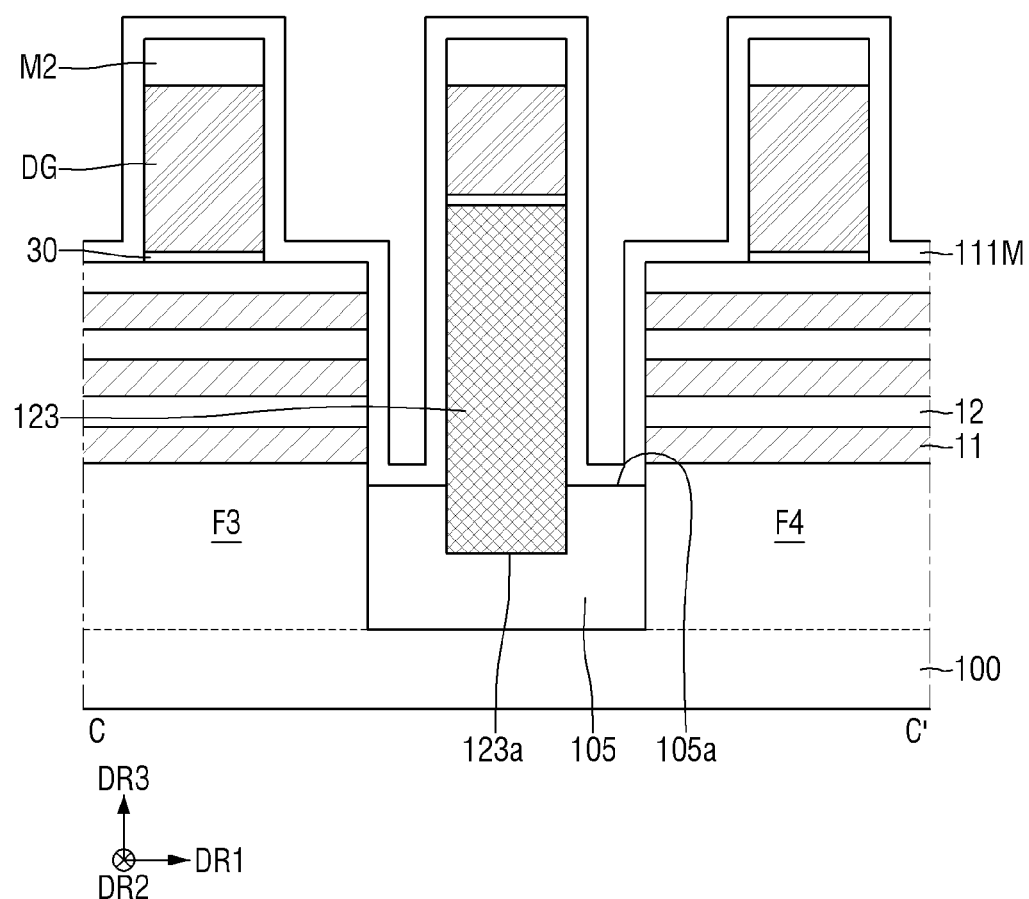

Referring to FIGS. 34 and 35, a second dam 122 may be formed in a portion in which the sacrificial layer (e.g., sacrificial layer 20 of FIG. 17) is removed between the second active pattern F2 and the third active pattern F3. Further, a fourth dam 124 may be formed in the portion in which the sacrificial layer (e.g., sacrificial layer 20 of FIG. 17) is removed between the third active pattern F3 and the fifth active pattern F5. Further, a third dam 123 may be formed in the portion in which the sacrificial layer (e.g., sacrificial layer 20 of FIG. 17) is removed between the third active pattern F3 and the fourth active pattern F4.

Subsequently, a spacer material layer 111M may be formed on the upper surface 105a of the field insulation layer 105, the side walls of each of the exposed second to fourth active patterns F2 to F4, the exposed first semiconductor layers 11, the exposed second semiconductor layers 12, and exposed second to fourth dams 122, 123, and 144, the exposed dummy gate DG, and the second mask pattern M2.

Figure 36:
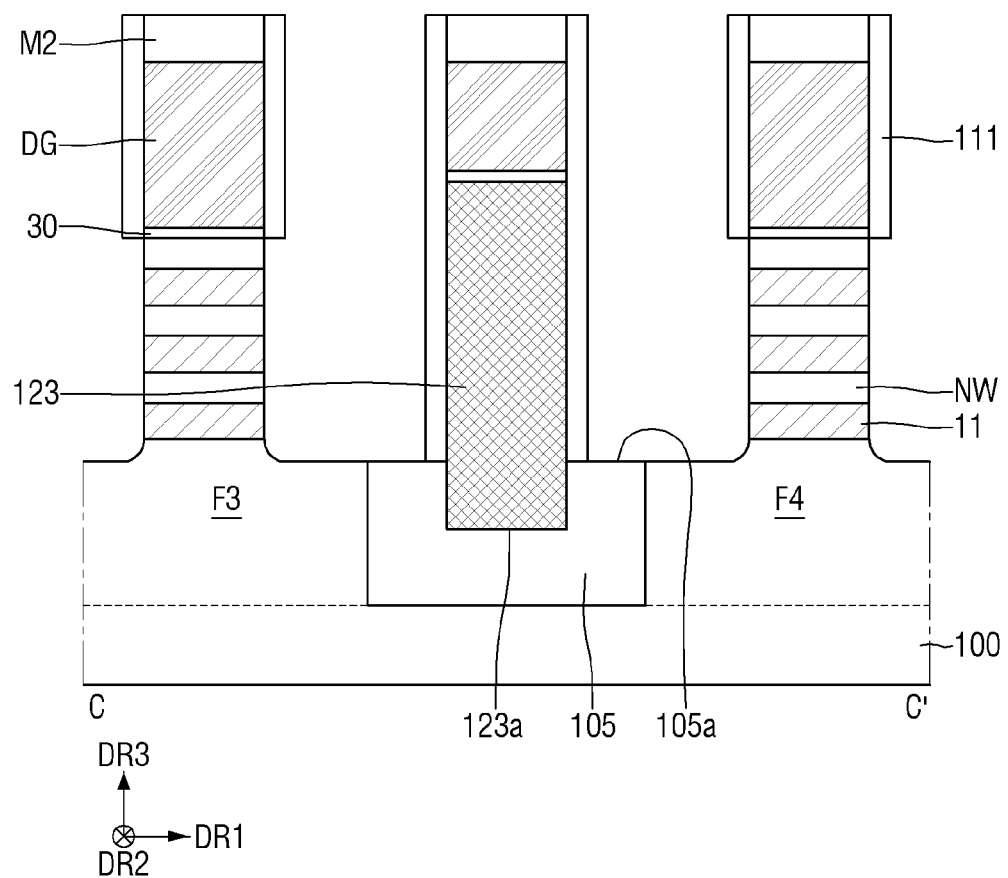

Referring to FIG. 36, the first semiconductor layers 11, the second semiconductor layers 12, a part of the third active pattern F3, and a part of the fourth active pattern F4 formed on both sides of the dummy gate DG may be etched through the etching process. While the etching process is performed, each of the upper surface of the second mask pattern M2 and the upper surface 105a of the field insulation layer 105 may be exposed. A gate spacer 111 may be formed on the side wall of the third dam 123, the side wall of the dummy gate DG, and the side wall of the second mask pattern M2 through the etching process.

Figure 37:
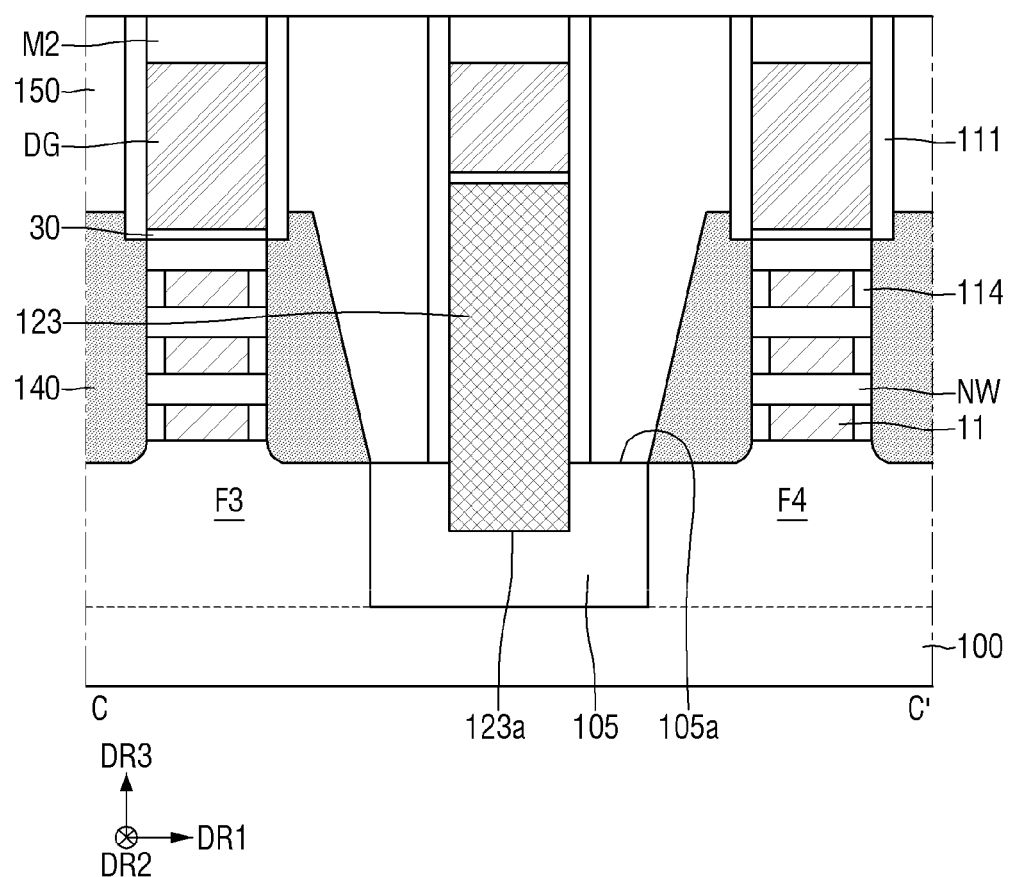

Referring to FIG. 37, a part of the side wall of the exposed second semiconductor layer 12 may be etched. Subsequently, an internal spacer 114 may be formed in the portion in which the second semiconductor layer 12 is etched.

Subsequently, a source/drain region 140 may be formed on both sides of the dummy gate DG in each of the third active pattern F3 and the fourth active pattern F4. Subsequently, the first interlayer insulating film 150 may be formed to cover the upper surface 105a of the field insulation layer 105, the gate spacer 111, and the source/drain region 140.

Figure 38:
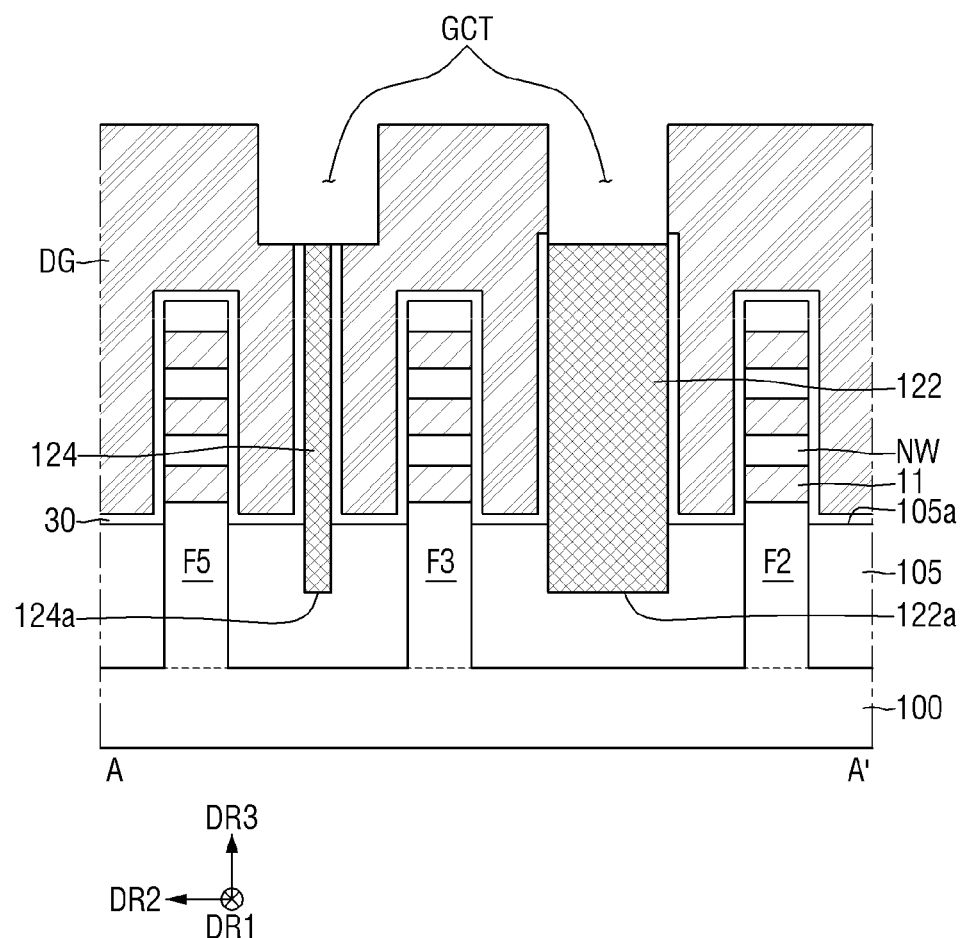
Figure 39:
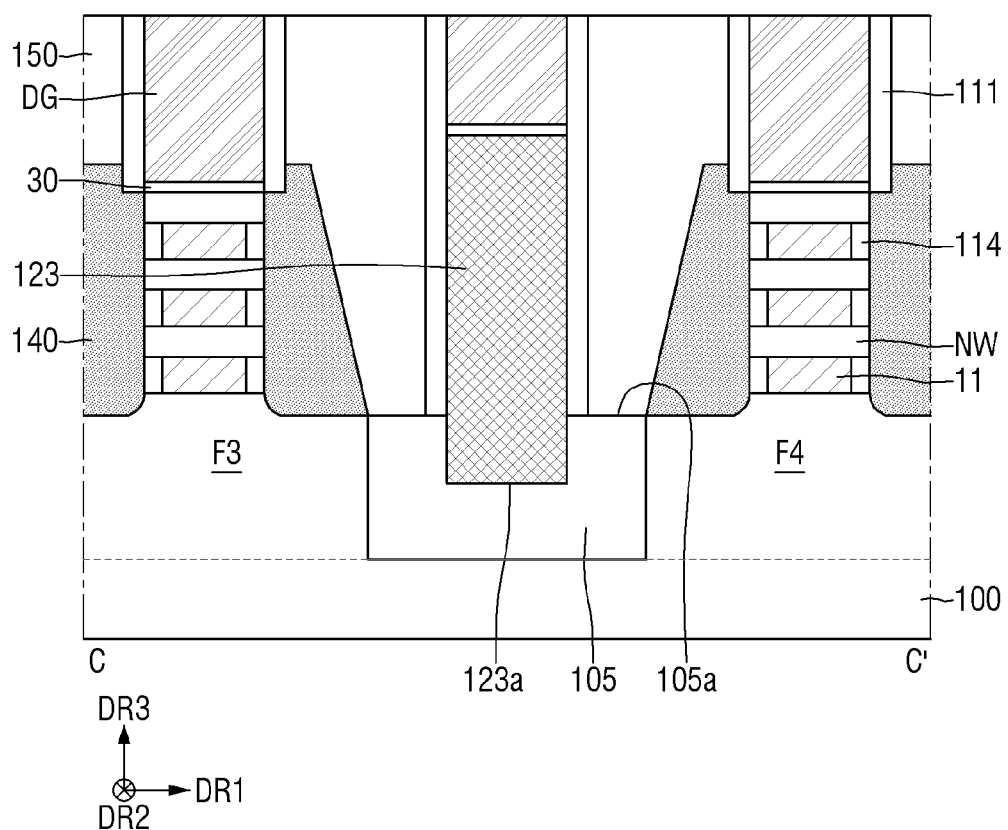

Referring to FIGS. 38 and 39, a part of the second mask pattern M2 and the first interlayer insulating film 150 may be removed through the flattening process. After the flattening process is performed, the dummy gate DG may be exposed.

Subsequently, the dummy gate DG and the liner layer 30 may be etched between the second active pattern F2 and the third active pattern F3 and between the third active pattern F3 and the fifth active pattern F5, thereby forming the gate cut trench GCT. The second dam 122 and the fourth dam 124 may be exposed by the gate cut trench GCT.

Figure 40:
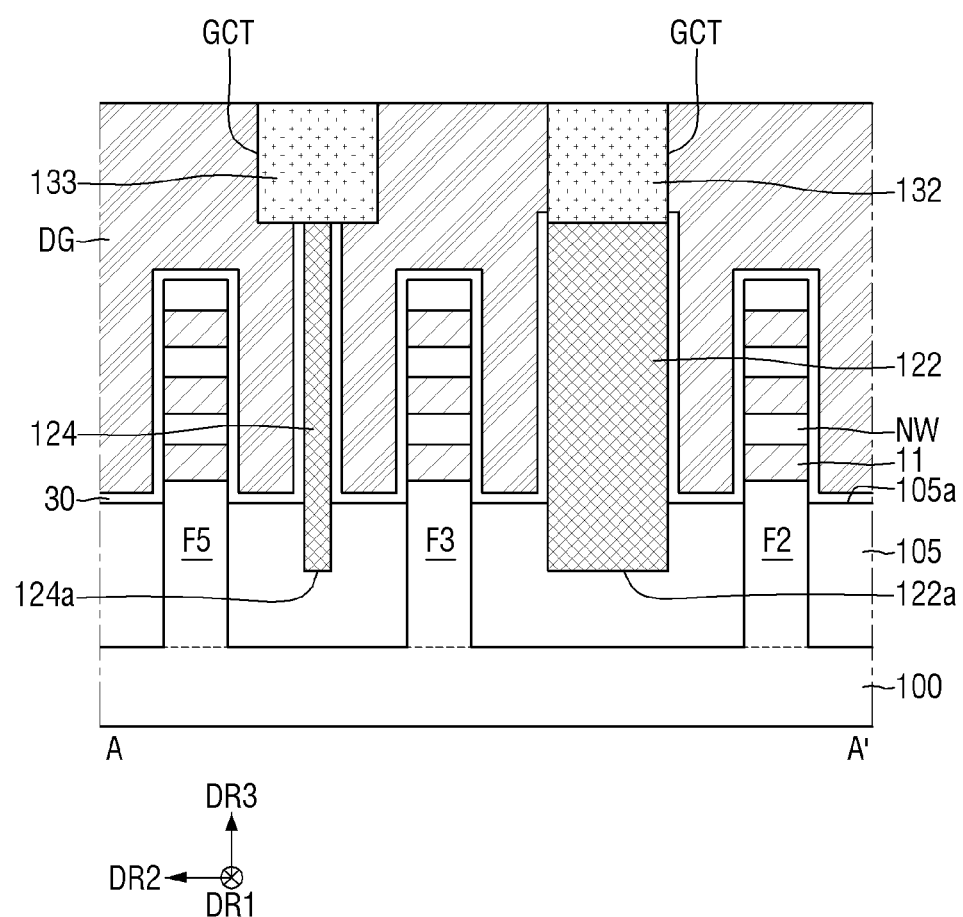

Referring to FIG. 40, a second gate cut 132 and a third gate cut 133 may be formed inside the gate cut trench GCT. Specifically, the second gate cut 132 may be formed inside the gate cut trench GCT formed on the second dam 122, and a third gate cut 133 may be formed inside the gate cut trench GCT formed on the fourth dam 124.

Subsequently, after the processes shown in FIGS. 28 to 31 are performed, the second interlayer insulating film 155, the gate contact 160, the etching stop film 170, the third interlayer insulating film 175 and the via 180 are sequentially formed, and the semiconductor device shown in FIGS. 2 to 4 may be fabricated.

Hereinafter, the semiconductor device according to some other example embodiments of the present disclosure will be described referring to FIG. 41. Differences from the semiconductor device shown in FIGS. 2 to 4 will be mainly described.

Figure 41:
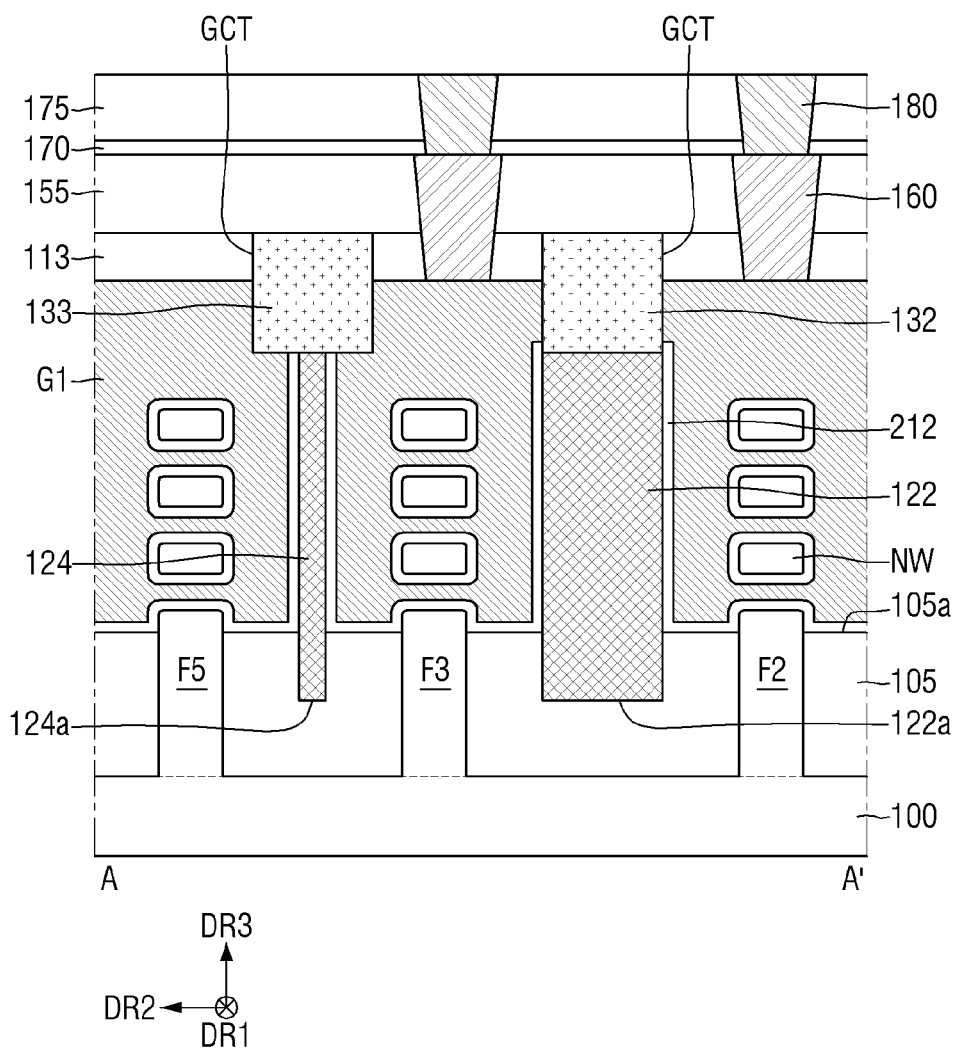
FIG. 41 is a cross-sectional view for explaining a semiconductor device, according to some other example embodiments of the present disclosure.

FIG. 41 is a cross-sectional view for explaining a semiconductor device according to some other embodiments of the present disclosure.

Referring to FIG. 41, in the semiconductor device according to some other example embodiments of the present disclosure, each of the second gate cut 132 and the third gate cut 133 may be in contact with the first gate electrode G1. For example, the gate insulation layer 212 is not disposed between the second gate cut 132 and the first gate electrode G1. Further, the gate insulation layer 212 is not disposed between the third gate cut 133 and the first gate electrode G1.

Hereinafter, a method for fabricating a semiconductor device according to some other example embodiments of the present disclosure will be described referring to FIGS. 42 to 47. Differences from the method for fabricating the semiconductor device shown in FIGS. 5 to 40 will be mainly described.

FIGS. 42 to 47 are intermediate stage diagrams for explaining a method for fabricating a semiconductor device according to some other example embodiments of the present disclosure.

Figure 42:
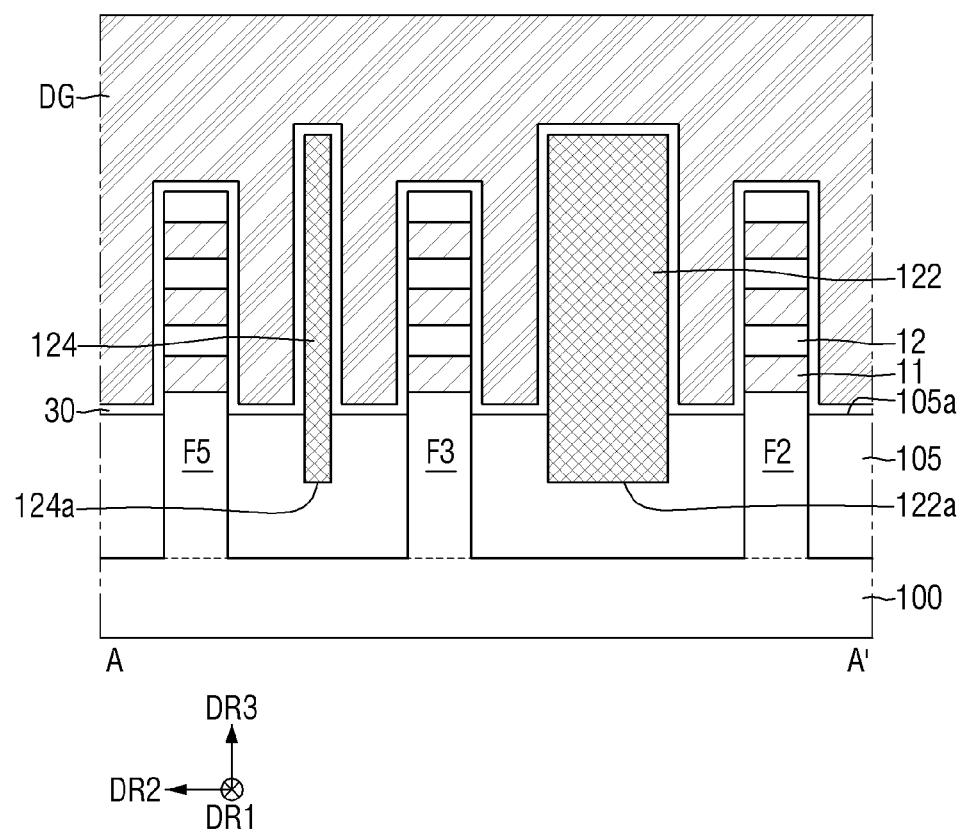
FIGS. 42 to 47 are intermediate stage diagrams for explaining a method for fabricating a semiconductor device, according to some other example embodiments of the present disclosure.
Figure 43:
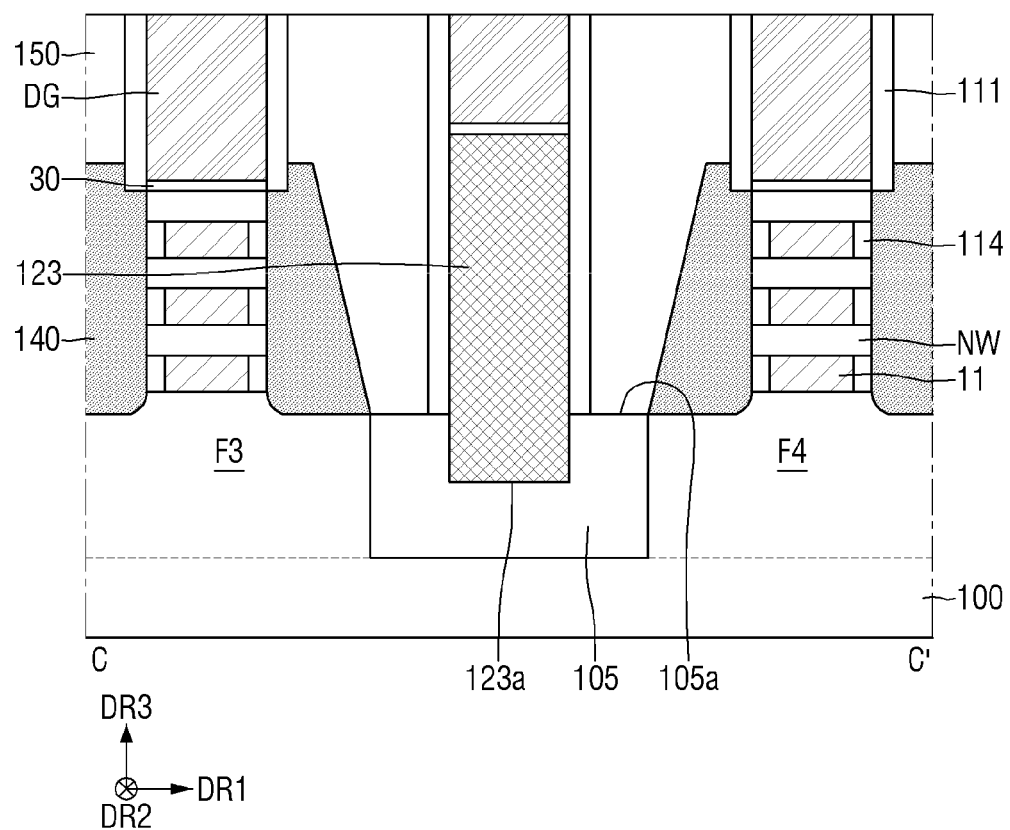

Referring to FIGS. 42 and 43, after the processes shown in FIGS. 5 to 18 and 32 to 37 are performed, a part of the second mask pattern M2 and the first interlayer insulating film 150 may be removed through the flattening process. After the flattening process is performed, the dummy gate DG may be exposed.

Figure 44:
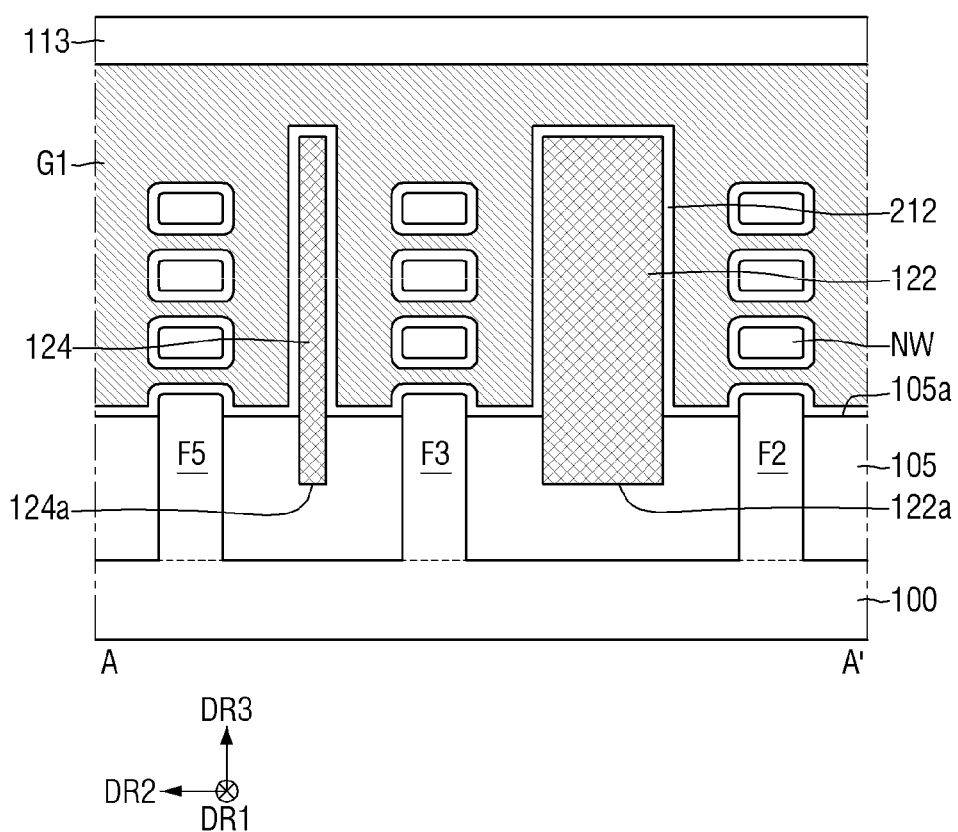
Figure 45:
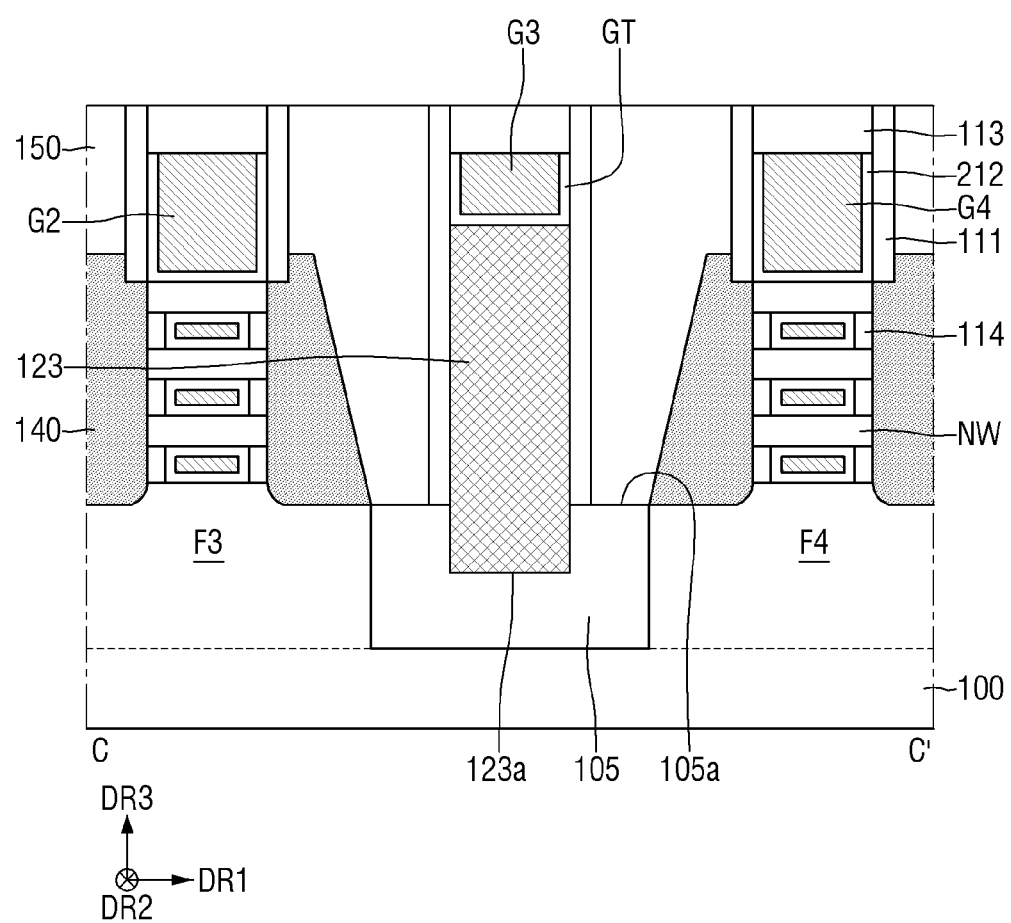

Referring to FIGS. 44 and 45, the dummy gate DG, the liner layer 30, and the first semiconductor layer 11 may be removed. Next, the gate insulation layer 212, the first to fourth gate electrodes G1 to G4, and the capping pattern 113 may be formed sequentially in the portion in which the dummy gate DG, the liner layer 30, and the first semiconductor layer 11 are removed.

Figure 46:
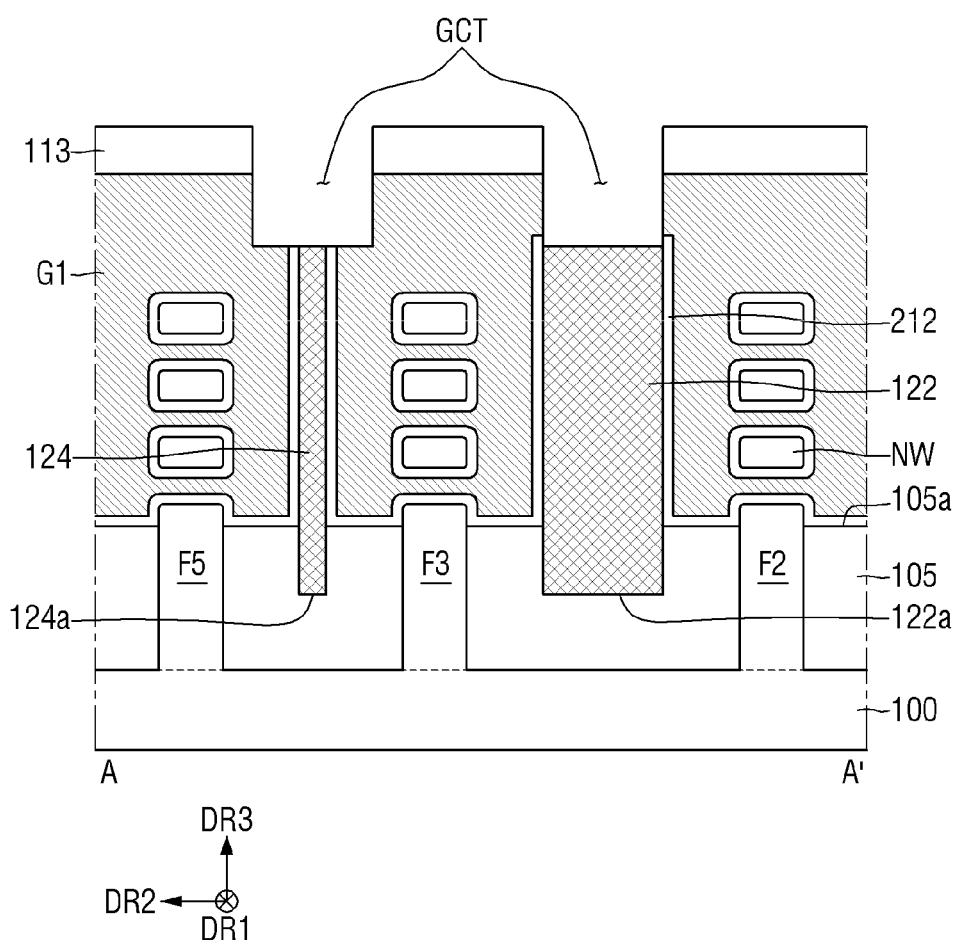

Referring to FIG. 46, the capping pattern 113, the first gate electrode G1, and the gate insulation layer 212 may be etched between the second active pattern F2 and the third active pattern F3 and between the third active pattern F3 and the fifth active pattern F5, thereby forming the gate cut trench GCT. The second dam 122 and the fourth dam 124 may be exposed by the gate cut trench GCT.

Figure 47:
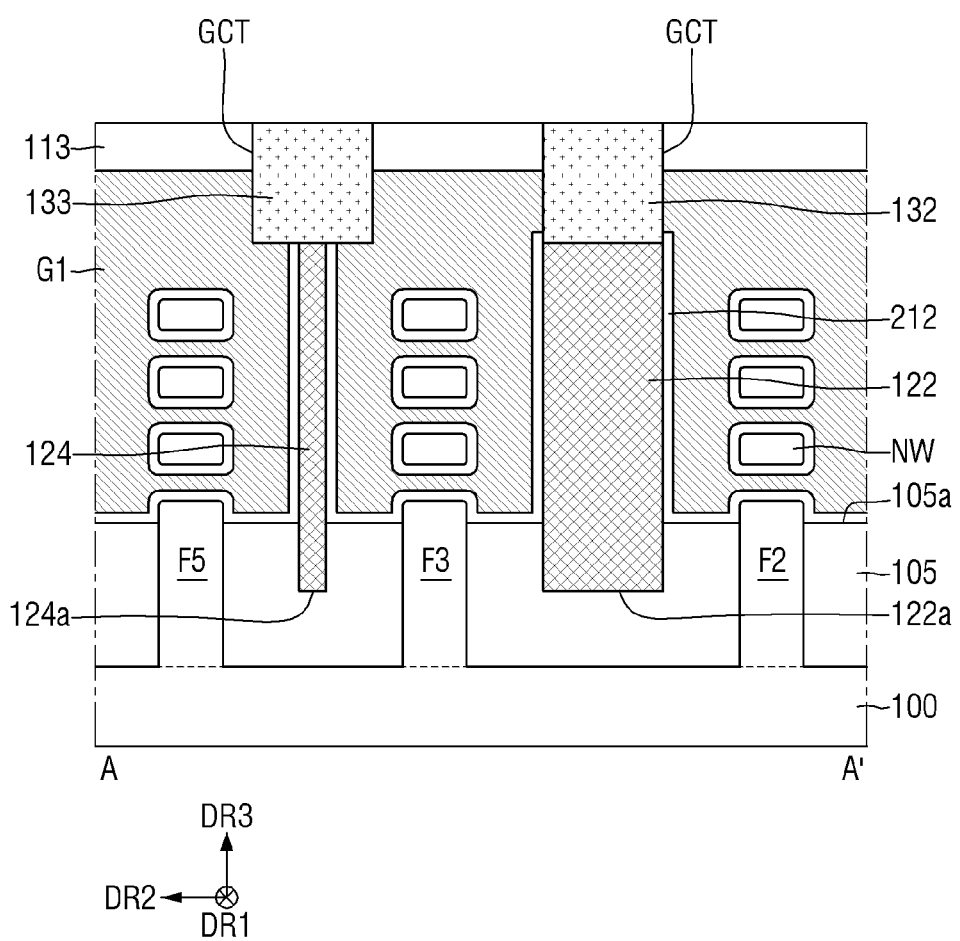

Referring to FIG. 47, a second gate cut 132 and a third gate cut 133 may be formed inside the gate cut trench GCT. Specifically, the second gate cut 132 may be formed inside the gate cut trench GCT formed on the second dam 122, and the third gate cut 133 may be formed inside the gate cut trench GCT formed on the fourth dam 124.

Subsequently, the second interlayer insulating film 155, the gate contact 160, the etching stop film 170, the third interlayer insulating film 175, and the via 180 are sequentially formed, and the semiconductor device shown in FIG. 41 may be fabricated.

Hereinafter, a semiconductor device according to some other example embodiments of the present disclosure will be described referring to FIG. 48. Differences from the semiconductor device shown in FIGS. 2 to 4 will be mainly described.

Figure 48:
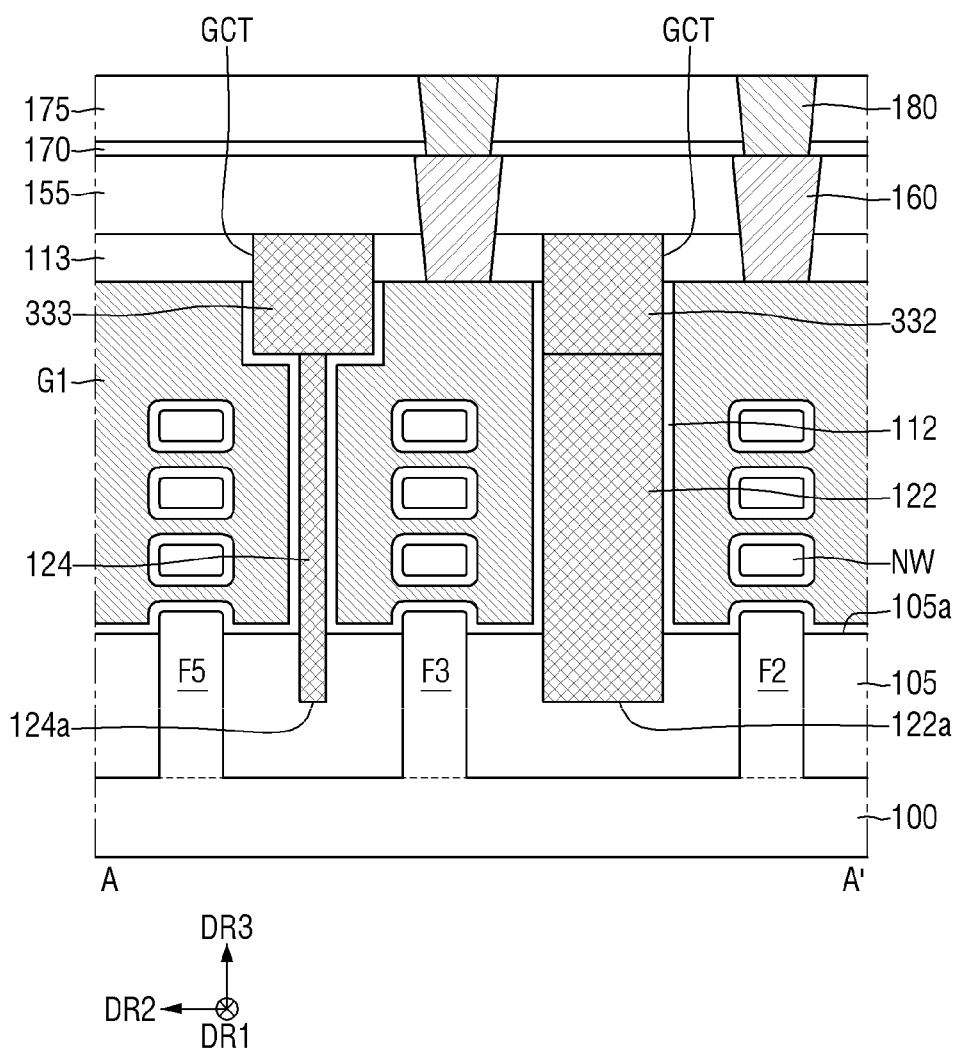
FIG. 48 is a cross-sectional view for explaining a semiconductor device, according to some other example embodiments of the present disclosure.

FIG. 48 is a cross-sectional view for explaining a semiconductor device according to some other example embodiments of the present disclosure.

Referring to FIG. 48, in the semiconductor device according to some other example embodiments of the present disclosure, the gate cut and the dam may include the same material. For example, each of the second gate cut 332 and the third gate cut 333 may include the same material as each of the second dam 122 and the fourth dam 124.

Hereinafter, a semiconductor device according to some other example embodiments of the present disclosure will be described referring to FIG. 49. Differences from the semiconductor devices shown in FIGS. 2 to 4 will be mainly described.

Figure 49:
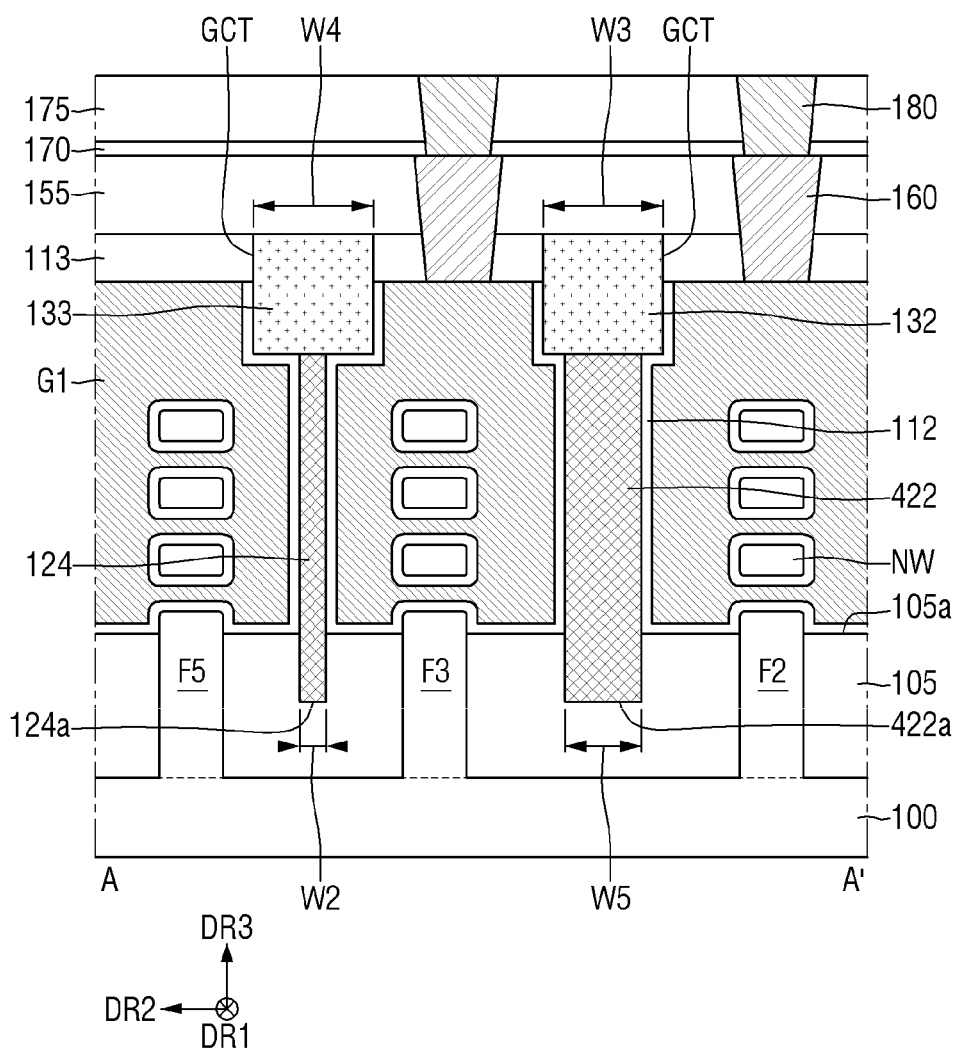
FIG. 49 is a cross-sectional view for explaining a semiconductor device, according to some other example embodiments of the present disclosure.

FIG. 49 is a cross-sectional view for explaining a semiconductor device according to some other example embodiments of the present disclosure.

Referring to FIG. 49, in the semiconductor device according to some other example embodiments of the present disclosure, a width W5 of the second dam 422 in the second direction DR2 may be smaller than a width W3 of the second gate cut 132 in the second direction DR2. The width W5 of the second dam 422 in the second direction DR2 may be greater than the width W2 of the fourth dam 124 in the second direction DR2. A lower surface 422a of the second dam 422 may be formed to be at a vertical level lower than that of the upper surface 105a of the field insulation layer 105. The second dam 422 may be made of the same material as that of the second dam 122.

Hereinafter, the semiconductor device according to some other example embodiments of the present disclosure will be described referring to FIG. 50. Differences from the semiconductor devices shown in FIGS. 2 to 4 will be mainly described.

Figure 50:
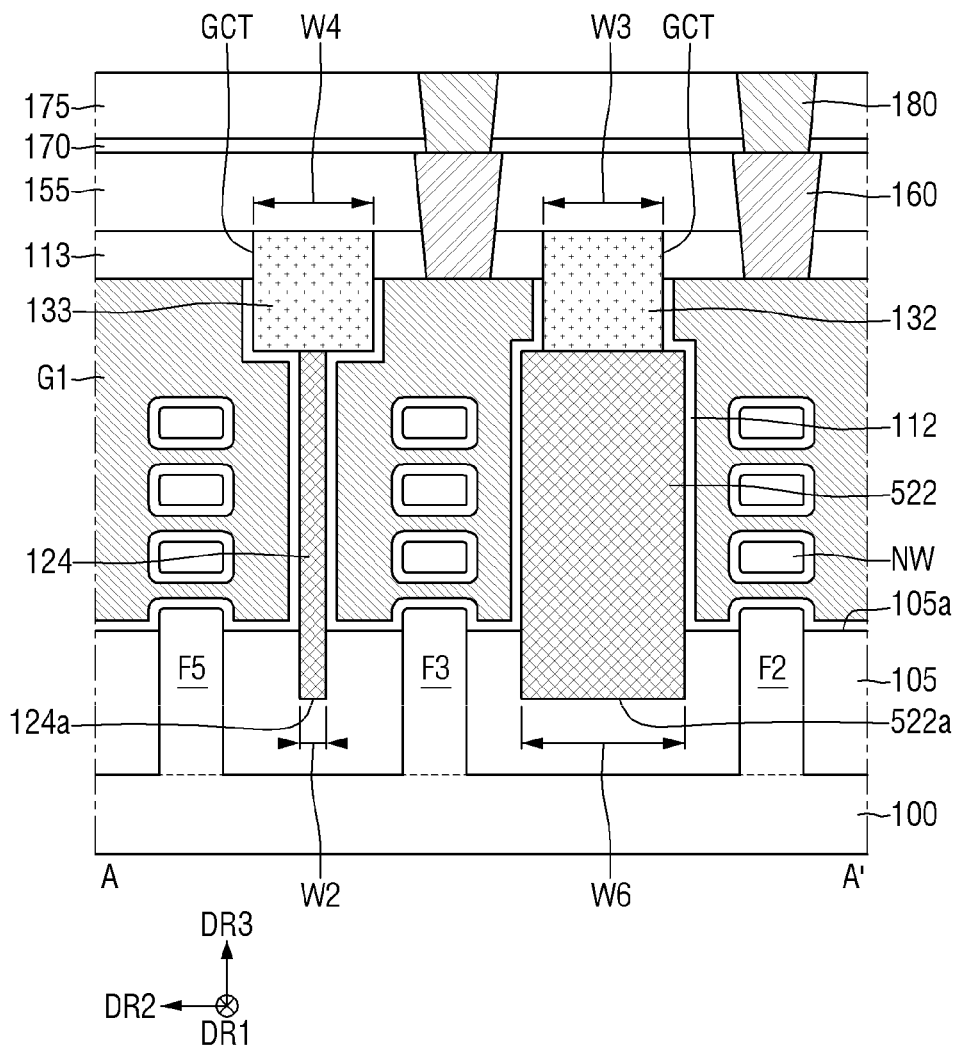
FIG. 50 is a cross-sectional view for explaining a semiconductor device, according to some other example embodiments of the present disclosure.

FIG. 50 is a cross-sectional view for explaining a semiconductor device according to some other example embodiments of the present disclosure.

Referring to FIG. 50, in the semiconductor device according to some other embodiment of the present disclosure, a width W6 of the second dam 522 in the second direction DR2 may be greater than the width W3 of the second gate cut 132 in the second direction DR2. The width W6 of the second dam 522 in the second direction DR2 may be greater than the width W2 of the fourth dam 124 in the second direction DR2. A lower surface 522a of the second dam 522 may be formed to be at a vertical level lower than that of the upper surface 105a of the field insulation layer 105. The second dam 522 may be made of the same material as that of the second dam 122.

Hereinafter, a semiconductor device according to some other example embodiments of the present disclosure will be described referring to FIG. 51. Differences from the semiconductor device shown in FIGS. 2 to 4 will be mainly described.

Figure 51:
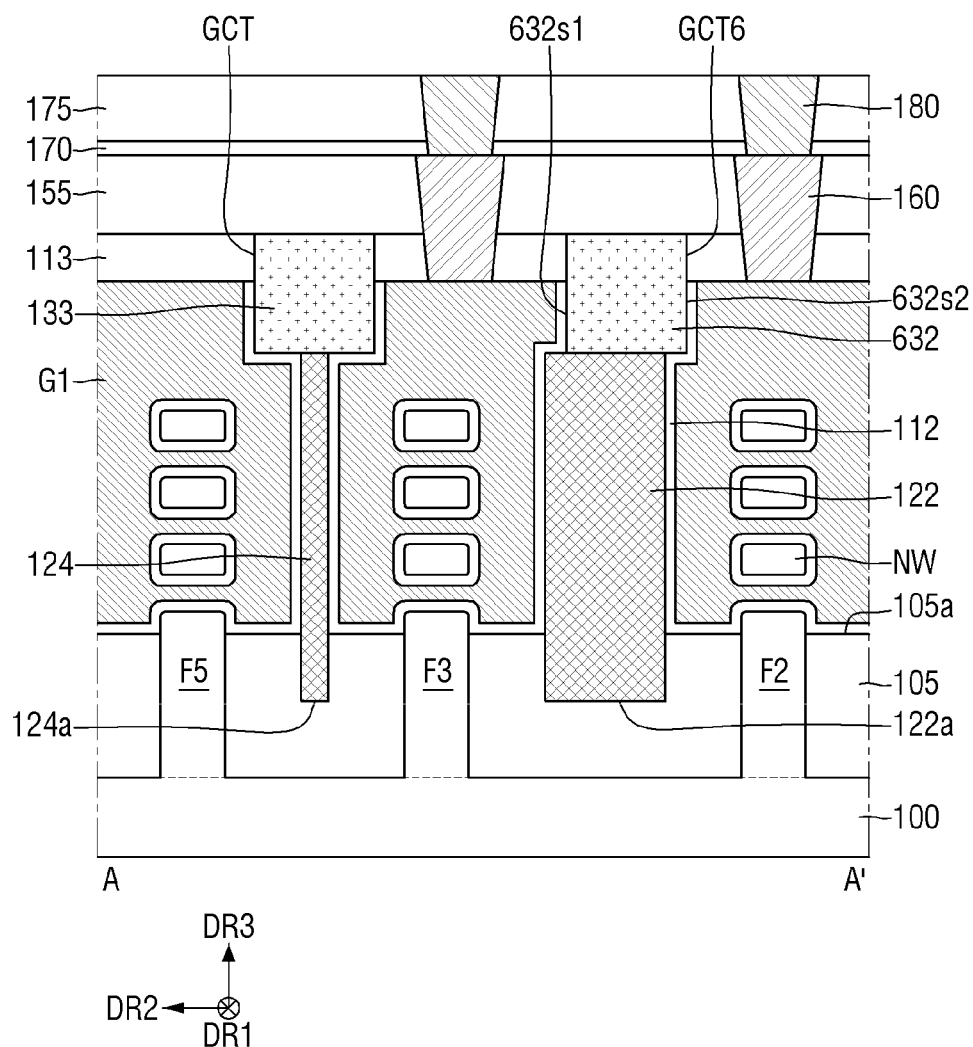
FIG. 51 is a cross-sectional view for explaining a semiconductor device, according to some other example embodiments of the present disclosure.

FIG. 51 is a cross-sectional view for explaining a semiconductor device according to some other example embodiments of the present disclosure.

Referring to FIG. 51, in the semiconductor device according to some other example embodiments of the present disclosure, a second gate cut 632 may be misaligned with the second dam 122 in the vertical direction DR3. The second gate cut 632 may be disposed inside a gate cut trench GCT6 that is misaligned with the second dam 122 in the vertical direction DR3 on the second dam 122.

For example, the second gate cut 632 may include a first side wall 632s1, and a second side wall 632s2 opposite to the first side wall 632s1 in the second direction DR2. The first side wall 632s1 of the second gate cut 632 may overlap the second dam 122 in the vertical direction DR3. The second side wall 632s2 of the second gate cut 632 may not overlap the second dam 122 in the vertical direction DR3. The second side wall 632s2 of the second gate cut 632 may overlap the first gate electrode G1 in the vertical direction DR3.

Hereinafter, a semiconductor device according to some other example embodiments of the present disclosure will be described referring to FIGS. 52 to 54. Differences from the semiconductor devices shown in FIGS. 1 to 4 will be mainly described.

Figure 52:
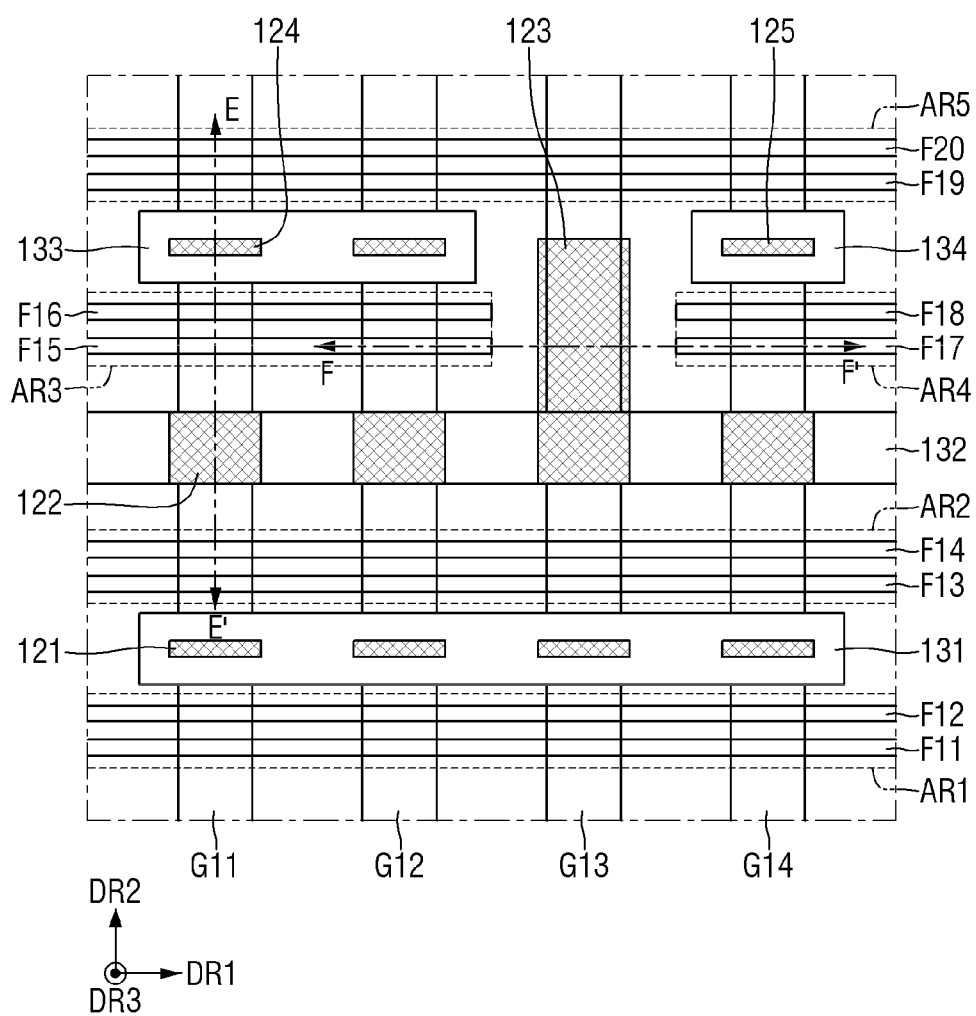
FIG. 52 is a layout diagram for explaining a semiconductor device, according to some other example embodiments of the present disclosure.

FIG. 52 is a layout diagram for explaining a semiconductor device according to some other example embodiments of the present disclosure. FIG. 53 is a cross-sectional view taken along a line E-E' of FIG. 52. FIG. 54 is a cross-sectional view taken along a line F-F' of FIG. 52.

Figure 53:
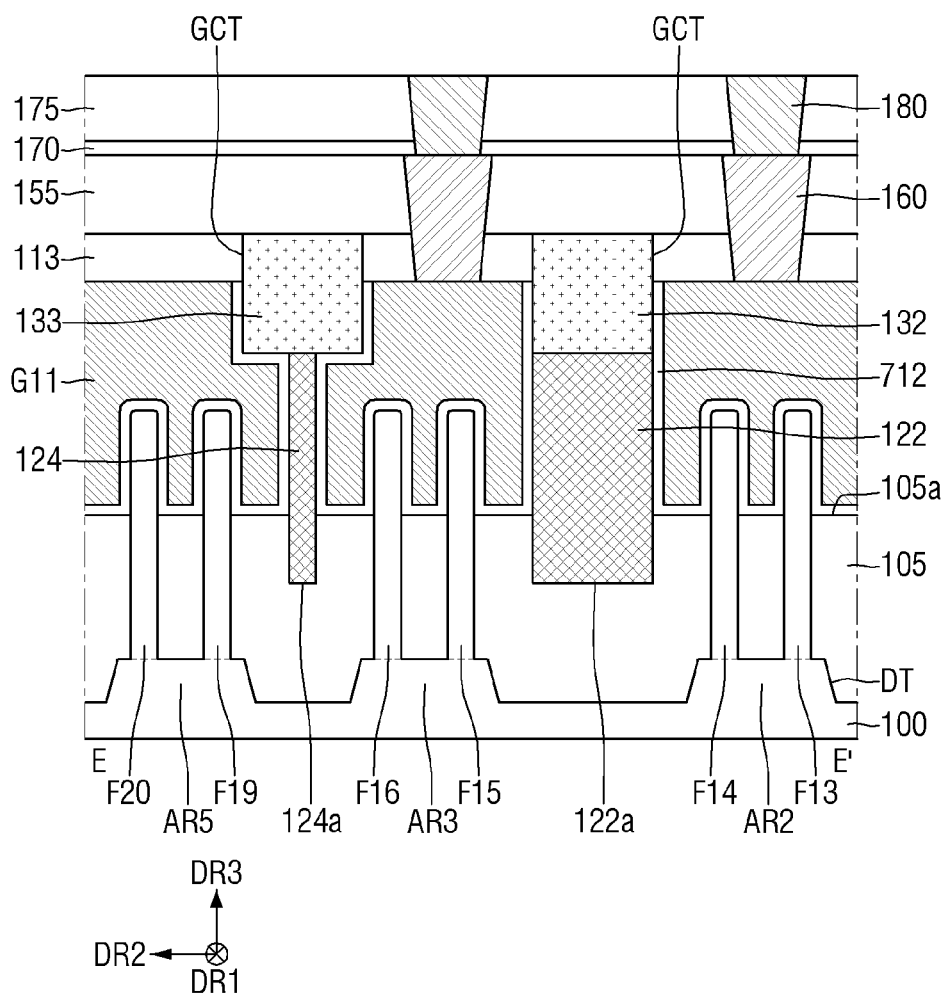
FIG. 53 is a cross-sectional view taken along E-E' of FIG. 52.
Figure 54:
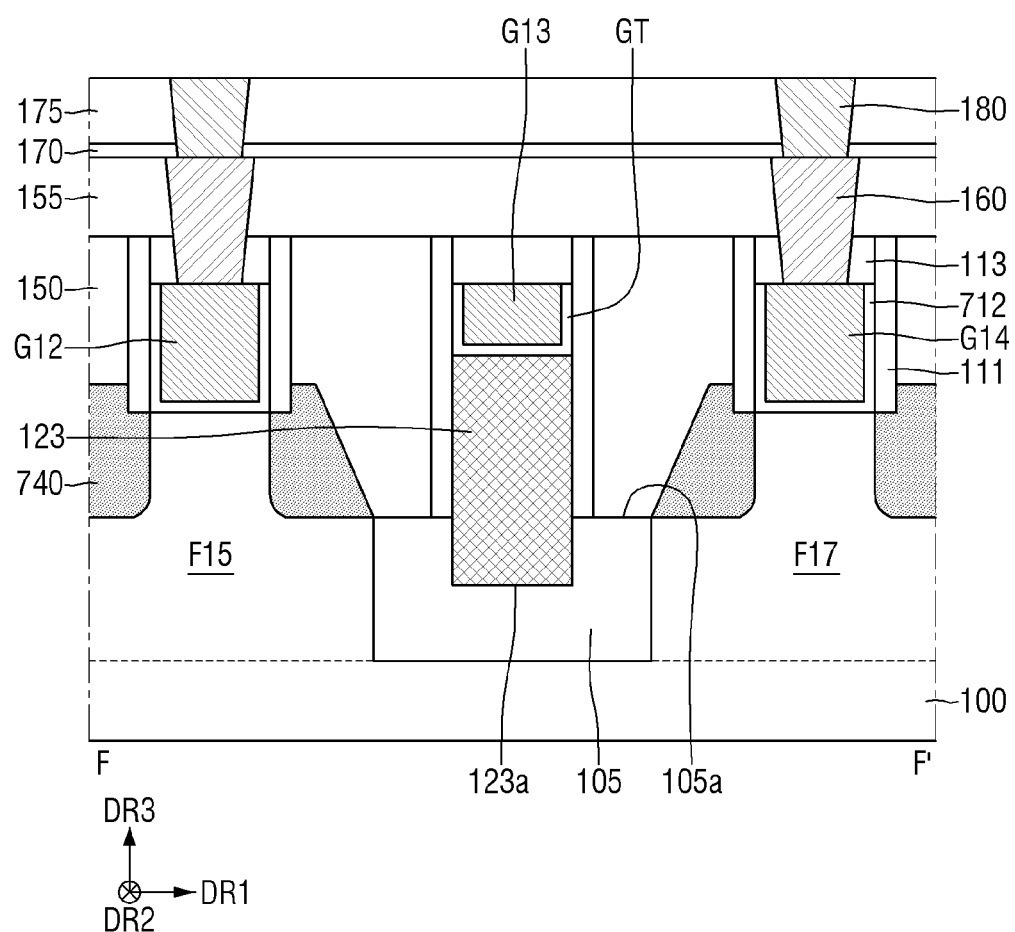
FIG. 54 is a cross-sectional view taken along F-F' of FIG. 52.

Referring to FIGS. 52 to 54, the semiconductor device according to some other example embodiments of the present disclosure may include a fin type transistor (FinFET). For example, the semiconductor device according to some other example embodiments of the present disclosure includes a substrate 100, first to fifth active regions AR1 to AR5, first to tenth active patterns F11 to F20, a field insulation layer 105, first to fourth gate electrodes G11 to G14, a gate spacer 111, a gate insulation layer 712, a capping pattern 113, first to fifth dams 121 to 125, first to fourth gate cuts 131 to 134, a source/drain region 740, a first interlayer insulating film 150, a second interlayer insulating film 155, a gate contact 160, an etching stop film 170, a third interlayer insulating film 175, and a via 180.

Each of the first to fifth active regions AR1 to AR5 may protrude from the substrate 100 in the vertical direction DR3. Each of the first to fifth active regions AR1 to AR5 may be defined by a deep trench DT formed on the substrate 100.

A first active region AR1 may extend lengthwise in the first direction DR1. A second active region AR2 may be spaced apart from the first active region AR1 in the second direction DR2. The second active region AR2 may extend lengthwise in the first direction DR1. A third active region AR3 may be spaced apart from the second active region AR2 in the second direction DR2. The third active region AR3 may extend lengthwise in the first direction DR1.

A fourth active region AR4 may be spaced apart from the second active region AR2 in the second direction DR2. The fourth active region AR4 may be spaced apart from the third active region AR3 in the first direction DR1. The fourth active region AR4 may extend in the first direction DR1. A fifth active region AR5 may be spaced apart from each of the third active region AR3 and the fourth active region AR4 in the second direction DR2. The fifth active region AR5 may extend in the first direction DR1.

Each of the first active pattern F11 and the second active pattern F12 may extend in the first direction DR1 on the first active region AR1. The second active pattern F12 may be spaced apart from the first active pattern F11 in the second direction DR2. Each of the third active pattern F13 and the fourth active pattern F14 may extend in the first direction DR1 on the second active region AR2. The fourth active pattern F14 may be spaced apart from the third active pattern F13 in the second direction DR2.

Each of the fifth active pattern F15 and the sixth active pattern F16 may extend lengthwise in the first direction DR1 on the third active region AR3. The sixth active pattern F16 may be spaced apart from the fifth active pattern F15 in the second direction DR2. Each of a seventh active pattern F17 and an eighth active pattern F18 may extend lengthwise in the first direction DR1 on the fourth active region AR4. The eighth active pattern F18 may be spaced apart from the seventh active pattern F17 in the second direction DR2. Each of the seventh active pattern F17 and the eighth active pattern F18 may be spaced apart from each of the fifth active pattern F15 and the sixth active pattern F16 in the first direction DR1.

Each of a ninth active pattern F19 and a tenth active pattern F20 may extend lengthwise in the first direction DR1 on the fifth active region AR5. The tenth active pattern F20 may be spaced apart from the ninth active pattern F19 in the second direction DR2.

Each of the first gate electrode G11 and the second gate electrode G12 may extend lengthwise in the second direction DR2 on the first to sixth active patterns F11 to F16 and the ninth and tenth active patterns F19 and F20. The second gate electrode G12 may be spaced apart from the first gate electrode G11 in the first direction DR1. The third gate electrode G13 may extend lengthwise in the second direction DR2 on the first to fourth active patterns F11 to F14 and the ninth and tenth active patterns F19 and F20. The third gate electrode G13 may be spaced apart from the second gate electrode G12 in the first direction DR1. The fourth gate electrode G14 may extend lengthwise in the second direction DR2 on the first to fourth active patterns F11 to F14 and the seventh to tenth active patterns F17 to F20. The fourth gate electrode G14 may be spaced apart from the third gate electrode G13 in the first direction DR1.

The first dam 121 may be disposed on the field insulation layer 105 between the second active pattern F12 and the third active pattern F13. The second dam 122 may be disposed on the field insulation layer 105 between the fourth active pattern F14 and the fifth active pattern F15, and between the fourth active pattern F14 and the seventh active pattern F17.

The third dam 123 may be disposed on the field insulation layer 105 between the third active region AR3 and the fourth active region AR4. The third dam 123 may extend lengthwise in the second direction DR2. A part of the third gate electrode G13 may be disposed on the third dam 123 between the third active region AR3 and the fourth active region AR4.

The fourth dam 124 may be disposed on the field insulation layer 105 between the sixth active pattern F16 and the ninth active pattern F19. The fifth dam 125 may be disposed on the field insulation layer 105 between the eighth active pattern F18 and the ninth active pattern F19. Lower surfaces of each of the first to fifth dams 121 to 125 may be formed to be at a vertical level lower than that of the upper surface 105a of the field insulation layer 105.

The gate insulation layer 712 may be disposed between each of the first to fourth gate electrodes G11 to G14 and the gate spacer 111. The gate insulation layer 712 may be disposed between each of the first to fourth gate electrodes G11 to G14 and each of the first to tenth active patterns F11 to F20. The gate insulation layer 712 may be disposed between each of the first to fourth gate electrodes G11 to G14 and the field insulation layer 105.

Further, the gate insulation layer 712 may be disposed between each of the first to fourth gate electrodes G11 to G14 and the first to fifth dams 121 to 125. The gate insulation layer 712 may be disposed between each of the first to fourth gate electrodes G11 to G14 and each of the first to fourth gate cuts 131 to 134.

The source/drain region 740 may be disposed on at least one side of each of the first to fourth gate electrodes G11 to G14 on each of the first to tenth active patterns F11 to F20.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor device comprising:
   a substrate;
   a first active pattern which extends lengthwise in a first direction on the substrate, and includes a first side wall and a second side wall opposite to the first side wall;
   a second active pattern which is spaced apart from the first active pattern in the first direction, extends lengthwise in the first direction, and includes a first side wall and a second side wall opposite to the first side wall;
   a field insulation layer which surrounds side walls of each of the first and second active patterns on the substrate;
   a first dam which is disposed between the first active pattern and the second active pattern, and has a lower surface at a vertical level lower than that of an upper surface of the field insulation layer;
   a second dam which is spaced apart from the first side wall of the first active pattern in a second direction different from the first direction, and has a lower surface at a vertical level lower than that of the upper surface of the field insulation layer;
   a first gate electrode which is disposed on the first dam between the first active pattern and the second active pattern, and extends lengthwise in the second direction;
   a second gate electrode which is spaced apart from the first gate electrode in the first direction and extends lengthwise in the second direction on the first active pattern; and
   a first gate cut which is spaced apart from each of the first side wall of the first active pattern and the first side wall of the second active pattern in the second direction, extends lengthwise in the first direction on the first dam, and intersects each of the first and second gate electrodes,
   wherein an uppermost surface of the first dam is at a vertical level higher than vertical levels of uppermost surfaces of the first and second active patterns.

2. The semiconductor device of claim 1, further comprising:
   a third dam which is spaced apart from the second side wall of the first active pattern in the second direction, and has a lower surface at a vertical level lower than that of the upper surface of the field insulation layer; and
   a second gate cut which is spaced apart from the second side wall of the first active pattern in the second direction, extends lengthwise in the first direction on the third dam, and intersects the second gate electrode,
   wherein a width of the second dam in the second direction is greater than a width of the third dam in the second direction.

3. The semiconductor device of claim 2, wherein the width of the third dam in the second direction is smaller than a width of the second gate cut in the second direction.

4. The semiconductor device of claim 1, further comprising:
   a gate insulation layer disposed between the first gate electrode and the first dam, and between the first gate electrode and the first gate cut.

5. The semiconductor device of claim 1, wherein the first dam includes a material different from the first gate cut.

6. The semiconductor device of claim 1, further comprising:
   a plurality of nanosheets disposed on the first active pattern to be spaced apart from each other in a vertical direction,
   wherein the second gate electrode surrounds the plurality of nanosheets.

7. The semiconductor device of claim 1, wherein a side wall of the first gate cut is in contact with the second gate electrode.

8. The semiconductor device of claim 1, wherein a width of the second dam in the second direction is different from a width of the first gate cut in the second direction.

9. The semiconductor device of claim 1,
   wherein the first gate cut includes a first side wall and a second side wall opposite to the first side wall,
   wherein the first side wall of the first gate cut overlaps the second dam in a vertical direction, and
   wherein the second side wall of the first gate cut does not overlap the second dam in the vertical direction.

10. A semiconductor device comprising:
    a substrate;
    a first active pattern extending lengthwise in a first direction on the substrate;
    a second active pattern which is spaced apart from the first active pattern in a second direction different from the first direction, and extends lengthwise in the first direction;

a third active pattern which is spaced apart from the second active pattern in the first direction and extends lengthwise in the first direction;

a fourth active pattern which is spaced apart from each of the second and third active patterns in the second direction and extends lengthwise in the first direction;

a field insulation layer which surrounds side walls of each of the first to fourth active patterns;

a first dam which is disposed between the second active pattern and the third active pattern and extends lengthwise in the second direction;

a second dam which is disposed between the first active pattern and the second active pattern;

a third dam which is disposed between the second active pattern and the fourth active pattern;

a first gate cut which extends lengthwise in the first direction between the first active pattern and the second active pattern, and is disposed on the first and second dams;

a second gate cut which extends in the first direction between the second active pattern and the fourth active pattern, and is disposed on the third dam;

a first gate electrode which is disposed on the first dam between the second active pattern and the third active pattern, extends lengthwise in the second direction, and intersects the first gate cut; and a second gate electrode which is spaced apart from the first gate electrode in the first direction, extends lengthwise in the second direction on the second active pattern, and intersects each of the first and second gate cuts, wherein a lower surface of the first dam between the second active pattern and the third active pattern is at a vertical level lower than that of an upper surface of the field insulation layer, and wherein a width of the second dam in the second direction is greater than a width of the third dam in the second direction.

11. The semiconductor device of claim 10, wherein a first pitch in the second direction between the first active pattern and the second active pattern is greater than a second pitch in the second direction between the second active pattern and the fourth active pattern.

12. The semiconductor device of claim 10, wherein the width of the third dam in the second direction is smaller than a width of the second gate cut in the second direction.

13. The semiconductor device of claim 10, wherein the first dam includes the same material as the first gate cut.

14. A semiconductor device comprising:
a substrate;
a first active pattern which extends lengthwise in a first direction on the substrate, and includes a first side wall and a second side wall opposite to the first side wall;
a second active pattern which is spaced apart from the first active pattern in the first direction, extends lengthwise in the first direction, and includes a first side wall and a second side wall opposite to the first side wall;
a field insulation layer which surrounds side walls of each of the first and second active patterns on the substrate;
a first dam which is disposed between the first active pattern and the second active pattern, and has a lower surface at a vertical level lower than a vertical level of an upper surface of the field insulation layer;

a second dam which is spaced apart from the first side wall of the first active pattern in a second direction different from the first direction, and has a lower surface at a vertical level lower than a vertical level of the upper surface of the field insulation layer;

a first gate electrode which is disposed between the first active pattern and the second active pattern, and extends lengthwise in the second direction;

a second gate electrode which is spaced apart from the first gate electrode in the first direction and extends lengthwise in the second direction on the first active pattern; and a first gate cut which is spaced apart from each of the first side wall of the first active pattern and the first side wall of the second active pattern in the second direction, extends lengthwise in the first direction on the first dam, and intersects each of the first and second gate electrodes, wherein a width in the second direction of the first gate cut at an upper surface of the first gate cut is the same as a width in the second direction of the first gate cut at a lower surface of the first gate cut, and wherein the width in the second direction of the first gate cut at the lower surface of the first gate cut is smaller than a width in the second direction of the first dam.

15. The semiconductor device of claim 14, further comprising:
a third dam which is spaced apart from the second side wall of the first active pattern in the second direction, and has a lower surface at a vertical level lower than that of the upper surface of the field insulation layer; and a second gate cut which is spaced apart from the second side wall of the first active pattern in the second direction, extends lengthwise in the first direction on the third dam, and intersects the second gate electrode, wherein a width of the second dam in the second direction is greater than a width of the third dam in the second direction.

16. The semiconductor device of claim 15, wherein the width of the third dam in the second direction is smaller than a width of the second gate cut in the second direction.

17. The semiconductor device of claim 14, further comprising:
a gate insulation layer disposed between the first gate electrode and the first dam, and between the first gate electrode and the first gate cut.

18. The semiconductor device of claim 14, further comprising:
a plurality of nanosheets disposed on the first active pattern to be spaced apart from each other in a vertical direction,
wherein the second gate electrode surrounds the plurality of nanosheets.

19. The semiconductor device of claim 14, wherein a side wall of the first gate cut is in contact with the second gate electrode.

20. The semiconductor device of claim 14, wherein a width of the second dam in the second direction is different from a width of the first gate cut in the second direction.

* * * * *